(12) United States Patent
Handa et al.

(10) Patent No.: US 7,265,450 B2
(45) Date of Patent: Sep. 4, 2007

(54) SEMICONDUCTOR DEVICE AND METHOD FOR FABRICATING THE SAME

(75) Inventors: Takato Handa, Shiga (JP); Hiroyuki Umimoto, Hyogo (JP); Tetsuya Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 273 days.

(21) Appl. No.: 10/900,272

(22) Filed: Jul. 28, 2004

(65) Prior Publication Data

US 2005/0054195 A1    Mar. 10, 2005

(30) Foreign Application Priority Data

Sep. 9, 2003    (JP) .............................. 2003-316568

(51) Int. Cl.
*H01L 23/48*    (2006.01)
(52) U.S. Cl. ..................... 257/774; 257/767; 257/758; 257/741; 257/E21.579; 438/597
(58) Field of Classification Search ................ 257/774, 257/767, 758.741
See application file for complete search history.

(56) References Cited

U.S. PATENT DOCUMENTS

| | | | |
|---|---|---|---|
| 6,011,311 A * | 1/2000 | Hsing et al. ................. | 257/774 |
| 6,437,441 B1 * | 8/2002 | Yamamoto ................... | 257/758 |
| 6,534,397 B1 * | 3/2003 | Okada et al. ................ | 438/633 |
| 7,176,577 B2 * | 2/2007 | Harada ........................ | 257/774 |
| 2001/0006225 A1 * | 7/2001 | Tsuchiya et al. .............. | 252/79 |
| 2002/0036352 A1 * | 3/2002 | Kim et al. .................... | 257/774 |
| 2002/0109234 A1 * | 8/2002 | Park et al. .................... | 257/767 |
| 2002/0192946 A1 * | 12/2002 | Oikawa et al. .............. | 438/637 |

FOREIGN PATENT DOCUMENTS

| | | |
|---|---|---|
| JP | 2000-299376 A | 10/2000 |
| JP | 2002-319617 A | 10/2002 |

\* cited by examiner

*Primary Examiner*—Asok K. Sarkar
*Assistant Examiner*—Victor V. Yevsikov
(74) *Attorney, Agent, or Firm*—McDermott Will & Emery LLP

(57) ABSTRACT

An inventive semiconductor device includes: a lower interlayer dielectric film provided on a substrate; a lower interconnect made up of a lower barrier metal layer formed along a wall surface of a lower interconnect groove in the lower interlayer dielectric film, and a copper film; and an upper plug and an upper interconnect. The upper plug passes through a silicon nitride film and comes into contact with the copper film of the lower interconnect. The lower interconnect is provided with a large number of convex portions buried in concave portions of the lower interconnect groove. Thus, voids in the lower interconnect are also gettered by the convex portions. Accordingly, the concentration of voids in the contact area between the lower interconnect and the upper plug is relieved, and an increase in contact resistance is suppressed.

21 Claims, 14 Drawing Sheets

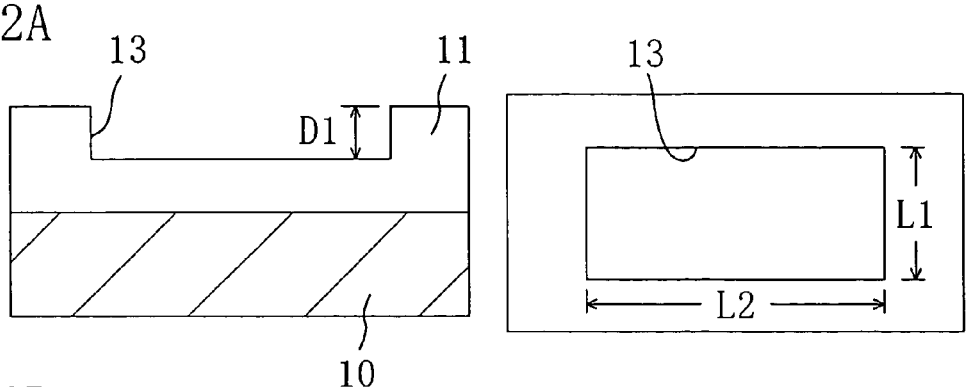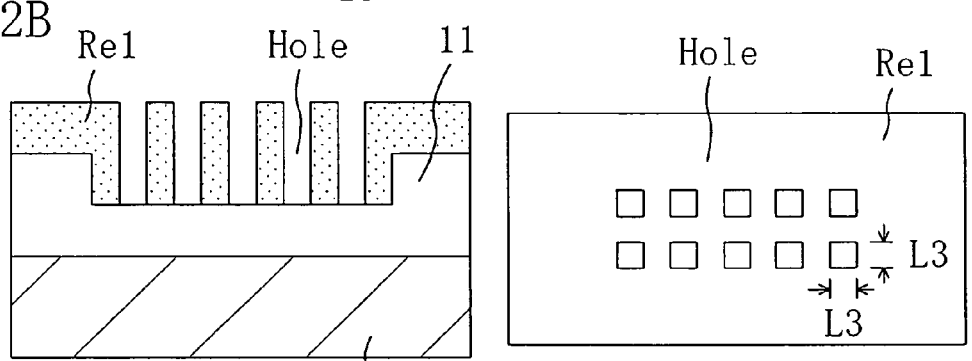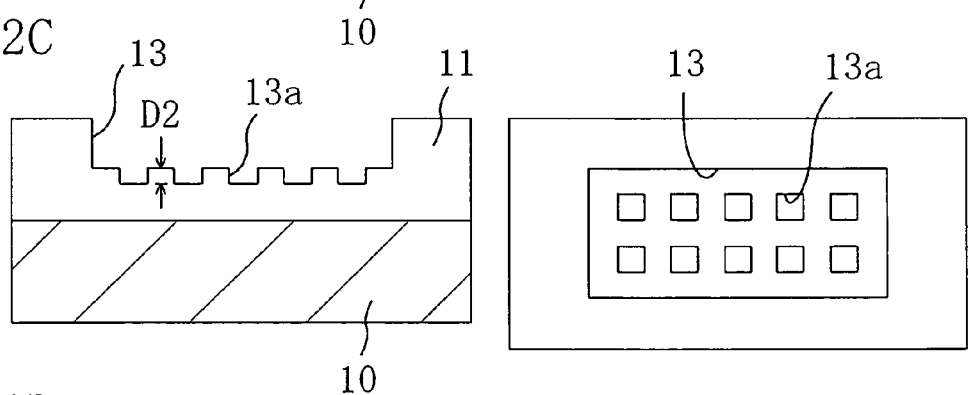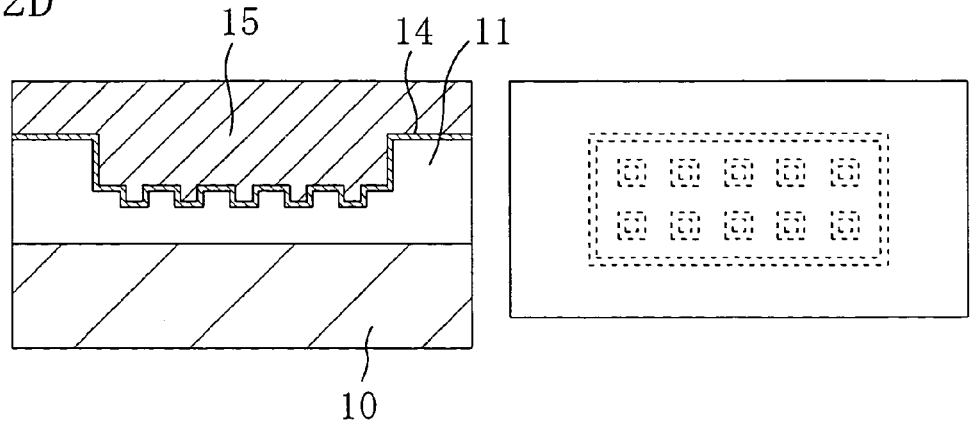

SEMICONDUCTOR DEVICE AND METHOD FOR FABRICATING THE SAME

BACKGROUND OF THE INVENTION

The present invention relates to a semiconductor device having a buried interconnect buried in an interlayer dielectric film, and a method for fabricating the device.

In recent years, a high-integration semiconductor device such as an ultra large scale integrated circuit (ULSI) has been required to enhance the speed of signal transmission, and to be highly resistant to migration intensified by an increase in power consumption. As an interconnect material that meets such requirements, an aluminum alloy has conventionally been used. However, in order to further enhance the speed of signal transmission, low resistivity copper whose resistance to electromigration is approximately ten times as high as that of aluminum has lately been used as an interconnect material.

As processes particularly suitable for formation of copper interconnect, a single damascene process and a dual damascene process are known. A single damascene process repeats the steps of filling a connection hole, formed in an interlayer dielectric film, with a conductor material, and then removing an excess portion of the interconnect material on the interlayer dielectric film by performing chemical/mechanical polishing (hereinafter, will be called "CMP"), thus forming a plug; and forming an upper interlayer dielectric film, filling an interconnect groove, formed in the upper interlayer dielectric film, with a conductor material, and then performing CMP to form an interconnect connected to the plug. On the other hand, a dual damascene process repeats the step of: forming, in a single interlayer dielectric film, a connection hole and an interconnect groove overlapping with this connection hole, filling the connection hole and the interconnect groove with an interconnect material at the same time, and then performing CMP to remove an excess portion of the interconnect material on the interlayer dielectric film.

By using a damascene process, an interconnect can be easily formed even if copper having difficulty in being patterned by dry etching is used as an interconnect material. In particular, a dual damascene process is more advantageous than a single damascene process in that the step of filling a connection hole and an interconnect groove with an interconnect material and the subsequent CMP step are each performed only once in order to form an interconnect (see, for example, Document 1 (Japanese Unexamined Patent Publication No. 2000-299376), and Document 2 (Japanese Unexamined Patent Publication No. 2002-319617)).

FIG. 14 is a cross-sectional view illustrating the structure of a conventional semiconductor device including interconnect layers formed by performing a dual damascene process.

As shown in FIG. 14, the conventional semiconductor device includes: a substrate 110 on which semiconductor elements (not shown) such as a large number of transistors are formed; a lower interlayer dielectric film 111 provided on the substrate 110; a lower interconnect groove 113 formed in the lower interlayer dielectric film 111; a lower barrier metal layer 114 formed along a wall surface of the lower interconnect groove 113; a copper film 115 for filling the lower interconnect groove 113; an upper interlayer dielectric film 117 provided on the lower interlayer dielectric film 111; a connection hole 118 formed in the upper interlayer dielectric film 117 and an upper interconnect groove 119 formed thereon; an upper barrier metal layer 120 formed along wall surfaces of the connection hole 118 and the upper interconnect groove 119; and a copper film 121 for filling the connection hole 118 and the upper interconnect groove 119. A lower interconnect 116 is made up of the copper film 115 and the lower barrier metal layer 114, formed in the lower interlayer dielectric film 111, for filling the lower interconnect groove 113. On the other hand, the upper interconnect groove 119 is formed in an extensive region of the upper interlayer dielectric film 117 including the connection hole 118. Further, portions of the upper barrier metal layer 120 and the copper film 121 filled in the connection hole 118 constitute an upper plug 122a, while another portions of the upper barrier metal layer 120 and the copper film 121 filled in the upper interconnect groove 119 constitute an upper interconnect 122b.

SUMMARY OF THE INVENTION

However, a semiconductor device having a copper interconnect formed by performing the above-described conventional damascene process or the like presents the following problems.

As shown in FIG. 14, a void concentration region 125 is likely to be formed in a portion of the lower interconnect 116 (or the copper film 115) in contact with the upper plug 122a, in particular. Furthermore, since an electrical resistance in the void concentration region 125 naturally increases, a contact resistance between the lower interconnect 116 and the upper plug 122a becomes excessive. As used herein, the "void concentration region" refers to the region where voids are concentrated.

The mechanism of formation of the void concentration region 125 is not yet completely elucidated. However, the cause of formation of the void concentration region 125 is believed to be due to the fact that, since the larger the area of the lower interconnect 116, the more likely the void concentration region 125 is to be formed, stress is generated in a portion of the lower interconnect 116 in contact with the upper plug 122a, and this stress causes voids present in the copper film 115 to be concentratedly gettered in the void concentration region 125.

In view of the above-described problems, an object of the present invention is to provide a semiconductor device that can suppress formation of a void concentration region in a portion of a lower interconnect in contact with an upper interconnect, and thus can suppress an increase in contact resistance between the lower and upper interconnects, and a method for fabricating such a device.

A first inventive semiconductor device includes: a lower interconnect that is provided within a lower interconnect groove formed in a lower interlayer dielectric film, and that has convex or concave portions at least at one of its bottom surface, side surfaces and upper surface; and an upper plug that passes through an upper interlayer dielectric film and comes into contact with a part of the lower interconnect.

Thus, voids are also gettered by the convex or concave portions of the lower interconnect, and therefore, it becomes possible to suppress an increase in contact resistance caused by the concentration of voids in the contact area between the lower interconnect and the upper plug.

By providing concave portions, convex portions, or irregular-shaped concave and convex portions at a bottom surface and/or side surfaces of the lower interconnect groove, the lower interconnect can be provided with the convex or concave portions corresponding to the concave portions, convex portions, or concave and convex portions of the lower interconnect groove.

If the lower interconnect includes a portion formed by a copper film, it becomes possible to utilize, in particular, an advantage that a reduction in interconnect resistance is achieved because of the use of a copper film.

A second inventive semiconductor device includes: a lower interconnect that is provided within a lower interconnect groove formed in a lower interlayer dielectric film; a conductor film for covering the lower interconnect; and an upper plug that passes through an upper interlayer dielectric film and comes into contact with a part of the conductor film.

Thus, the concentration of stress in a portion of the lower interconnect located below the upper plug is relieved, and therefore, an increase in contact resistance can be suppressed.

A third inventive semiconductor device includes: a lower interconnect which is provided within a lower interconnect groove formed in a lower interlayer dielectric film, and into which dopant is implanted; and an upper plug that passes through an upper interlayer dielectric film and comes into contact with a part of the lower interconnect.

Thus, voids are also gettered by the dopant present in the lower interconnect, and therefore, it becomes possible to suppress an increase in contact resistance caused by the concentration of voids in the contact area between the lower interconnect and the upper plug.

In a first inventive method for fabricating a semiconductor device, a lower interconnect groove having concave or convex portions at its bottom surface is formed in a lower interlayer dielectric film, the lower interconnect groove is filled with a conductor material to form a lower interconnect having convex or concave portions, and then an upper interlayer dielectric film and an upper plug are formed.

By performing this method, the structure of the first inventive semiconductor device can be easily obtained. More specifically, it becomes possible to facilitate the fabrication of the semiconductor device that can achieve the effect of relieving the concentration of voids in the contact area between the upper plug and the lower interconnect.

As a method for forming an interconnect groove having concave portions at least partially at its bottom surface, the present invention may employ any of: a method for forming concave or convex portions at a bottom surface of a lower interconnect groove by performing etching using an etching mask; a method for forming concave or convex portions at side surfaces of a lower interconnect groove by etching side surfaces of a lower interlayer dielectric film having a second layer; and a method for performing etching such that a deposition film remains on bottom and side surfaces of a lower interconnect groove, and subsequently etching portions of a lower interlayer dielectric film exposed to the lower interconnect groove, thus forming irregular-shaped concave and convex portions at the bottom and side surfaces of the lower interconnect groove.

In a second inventive method for fabricating a semiconductor device, a lower interconnect buried in a lower interconnect groove is formed, a stress-relieving conductor film is formed over the lower interconnect groove, and then an upper interlayer dielectric film and an upper plug are formed.

By performing this method, the structure of the second inventive semiconductor device can be easily obtained. More specifically, it becomes possible to facilitate the fabrication of the semiconductor device that can achieve the effect of relieving the concentration of voids in the contact area between the upper plug and the lower interconnect.

In a third inventive method for fabricating a semiconductor device, a lower interconnect groove is formed in a lower interlayer dielectric film, the lower interconnect groove is filled with a conductor material to form a lower interconnect, dopant ions are implanted into the lower interconnect, and then an upper interlayer dielectric film and an upper plug are formed.

By performing this method, the structure of the third inventive semiconductor device can be easily obtained. More specifically, it becomes possible to facilitate the fabrication of the semiconductor device that can achieve the effect of relieving the concentration of voids in the contact area between the upper plug and the lower interconnect.

The inventive semiconductor devices or the inventive fabricating methods thereof each relieve the concentration of voids in the contact area between the lower interconnect and the upper plug. Thus, the present invention can provide a semiconductor device in which contact resistance in its interconnect layer is low, and a method for fabricating such a semiconductor device.

BRIEF DESCRIPTION OF THE DRAWINGS

FIGS. 2A through 2D are cross-sectional views and plan views illustrating the first half of the process for fabricating the semiconductor device of the first embodiment.

DESCRIPTION OF THE PREFERRED EMBODIMENTS

First Embodiment

Figure 1:
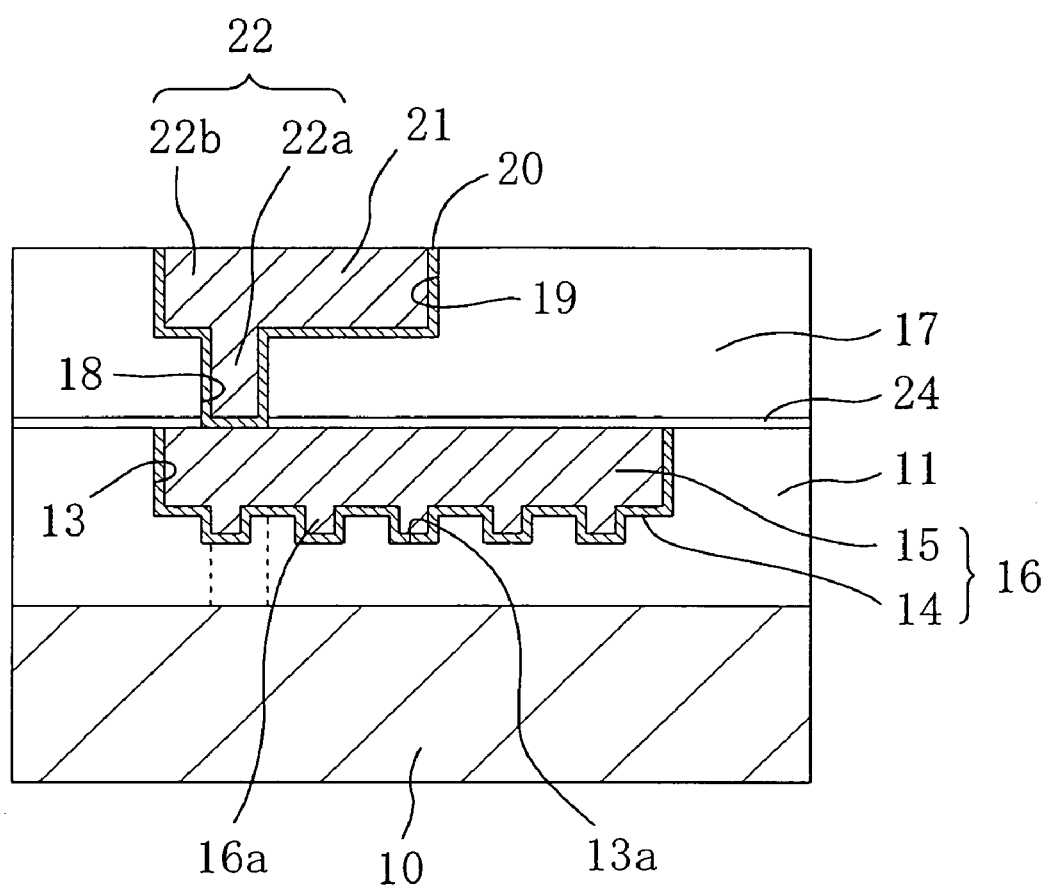
FIG. 1 is a cross-sectional view illustrating the structure of a semiconductor device according to a first embodiment of the present invention.

FIG. 1 is a cross-sectional view illustrating the structure of a semiconductor device according to a first embodiment of the present invention. As shown in FIG. 1, the semiconductor device of the present embodiment includes: a substrate 10 on which semiconductor elements (not shown) such as a large number of transistors are formed; a lower interlayer dielectric film 11 provided on the substrate 10; a lower interconnect groove 13 formed in the lower interlayer dielectric film 11; a lower barrier metal layer 14 formed along a wall surface of the lower interconnect groove 13; a copper film 15 for filling the lower interconnect groove 13 together with the barrier metal layer 14; a silicon nitride film 24 provided on the lower interlayer dielectric film 11 and on the copper film 15; an upper interlayer dielectric film 17 provided on the silicon nitride film 24; a connection hole 18 formed in the upper interlayer dielectric film 17 and an upper interconnect groove 19 formed thereon; an upper barrier metal layer 20 formed along wall surfaces of the connection hole 18 and the upper interconnect groove 19; and a copper film 21 for filling the connection hole 18 and the upper interconnect groove 19. A lower interconnect 16 is made up of the copper film 15 and the lower barrier metal layer 14 which fill the lower interconnect groove 13. On the other hand, the upper interconnect groove 19 is formed in an extensive region of the upper interlayer dielectric film 17 including the connection hole 18. Further, portions of the upper barrier metal layer 20 and the copper film 21 filled in the connection hole 18 constitute an upper plug 22a, while another portions of the upper barrier metal layer 20 and the copper film 21 filled in the upper interconnect groove 19 constitute an upper interconnect 22b. The upper plug 22a passes through the silicon nitride film 24 and comes into contact with the copper film 15 of the lower interconnect 16. The upper plug 22a and the upper interconnect 22b constitute an upper interconnect layer 22.

The semiconductor device of the present embodiment is characterized in that the lower surface of the lower interconnect groove 13, formed in the lower interlayer dielectric film 11, is not flat, but has many concave portions 13a, and the lower interconnect 16 has convex portions 16a having shapes corresponding to those of the concave portions 13a. Even if the concave and convex portions 13a and 16a are provided only at a single position, the after-mentioned effects can be achieved. In the present embodiment, the lower interconnect 16 has a thickness of 0.3 μm, for example, and a planar size of 0.38 μm×1.5 μm, i.e., a width of 0.38 μm and a length of 1.5 μm, for example, while each concave portion 13a has a depth of 0.1 μm, for example, and a planar size of 0.2 μm×0.2 μm, for example. The upper plug 22a has a planar size of 0.2 μm×0.2 μm, for example. In the conventional structure, it is known that if the lower interconnect groove 13 has a width equal to or greater than 0.25 μm and a length equal to or greater than 1 μm, a void concentration region is likely to be formed, in particular, in the lower interconnect 16.

The present embodiment is applicable to the substrate 10 even if another lower interlayer dielectric film and/or interconnect layer are/is further provided. In the present embodiment, as indicated by the broken lines in FIG. 1, another lower interconnect and/or another plug that reaches the semiconductor substrate are/is further provided below the lower interconnect 16. In general, the semiconductor device is often provided with three or more interconnect layers; however, each of these interconnect layers preferably has the shape of the lower interconnect 16 described in the present embodiment.

In the semiconductor device of the present embodiment, the lower interconnect 16 is provided with the convex portions 16a, and thus voids are also gettered by the convex portions 16a. Therefore, it becomes possible to prevent voids from being concentratedly gettered in a region of the lower interconnect 16 in contact with the upper plug 22a. Thus, it is presumed that the convex portions 16a achieve the function of gettering voids because stress is generated in the convex portions 16a.

Figure 3A:
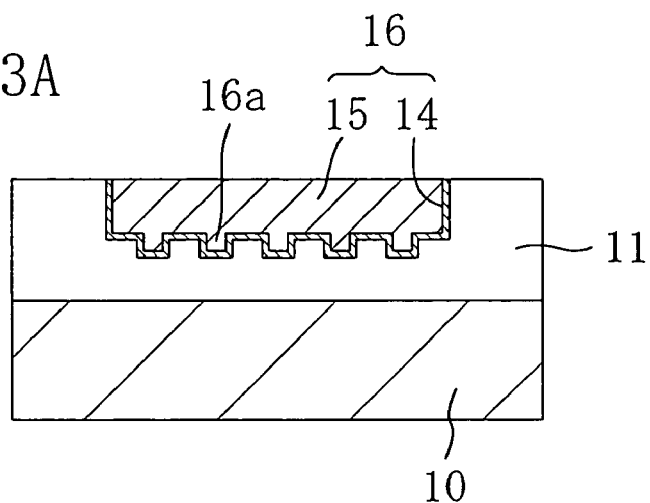
FIGS. 3A through 3C are cross-sectional views illustrating the latter half of the process for fabricating the semiconductor device of the first embodiment.
Figure 3B:
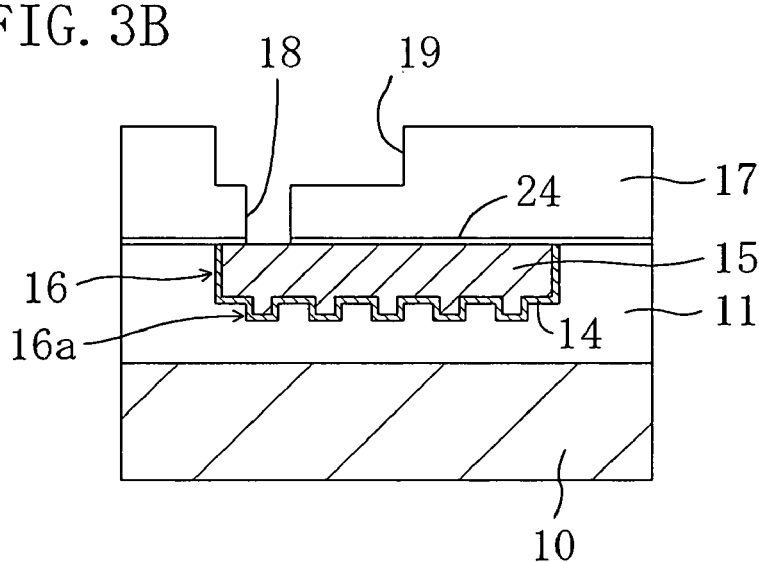
Figure 3C:
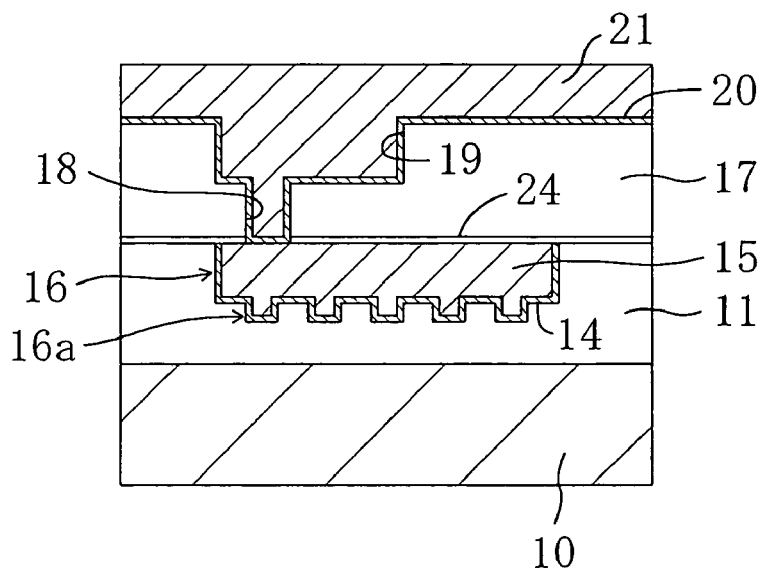

Hereinafter, a method for fabricating the semiconductor device according to the present embodiment will be described. FIGS. 2A through 2D are cross-sectional views and plan views illustrating the first half of the process for fabricating the semiconductor device of the present embodiment. FIGS. 3A through 3C are cross-sectional views illustrating the latter half of the process for fabricating the semiconductor device of the present embodiment. The cross-sectional views of the semiconductor device are shown in the left part of FIGS. 2A through 2D, while the plan views of the semiconductor device are shown in the right part of FIGS. 2A through 2D.

First, in the step shown in FIG. 2A, a lower interlayer dielectric film 11 formed of a BPSG film with a thickness of about 1 μm is deposited on a substrate 10, and then a lower interconnect groove 13 is formed in the lower interlayer dielectric film 11 by a known lithography and dry etching process. In this case, the depth D1 of the lower interconnect groove 13, shown in the left part of FIG. 2A, is about 0.3 μm. On the other hand, the size L1 and size L2 of the lower interconnect groove 13, shown in the right part of FIG. 2A, are 0.38 μm and 1.5 μm, respectively.

Next, in the step shown in FIG. 2B, a lithography process is performed to form, on the lower interlayer dielectric film 11, a resist film Re1 having a large number of openings Hole. In this case, the planar sizes L3 and L4 of the opening Hole, shown in the right part of FIG. 2B, are each about 0.2 μm.

Subsequently, in the step shown in FIG. 2C, a dry etching process is performed to remove portions of the lower interlayer dielectric film 11 located below the openings Hole of the resist film Re1, thus forming concave portions 13a at the bottom surface of the lower interconnect groove 13. In this case, the depth D2 of each concave portion 13a, shown in the left part of FIG. 2C, is 0.1 μm, for example. Thereafter, an ashing process is performed to remove the resist film Re1.

In the present embodiment and a fourth embodiment described later, the concave portions 13a are each formed as a concave portion with a bottom. Alternatively, if a conductor member is not exposed in regions of the upper surface of the substrate 10 located directly below the concave portions 13a, the concave portions 13a may pass through the lower interlayer dielectric film 11.

Next, in the step shown in FIG. 2D, a sputtering process, for example, is performed to deposit, on the lower interlayer dielectric film 11, a lower barrier metal layer 14 formed of a TaN film with a thickness of about 50 nm, and then a copper film 15 is formed on the lower barrier metal layer 14 by a sputtering process, a CVD process, an electroplating process or the like until the copper film 15 is filled in the lower interconnect groove 13. If an electroplating process is performed, a seed layer made of the same material as the interconnect material (which is copper in the present embodiment) is formed. The TaN film has the function of suppressing diffusion of copper atoms.

Thereafter, in the step shown in FIG. 3A, the copper film 15 and the lower barrier metal layer 14 are planarized by a CMP process in which the copper film 15 and the lower barrier metal layer 14 are partially removed until the upper surface of the lower interlayer dielectric film 11 is exposed. Thus, a lower interconnect 16 made up of the copper film 15 and the lower barrier metal layer 14 is formed. Further, at the bottom surface of the lower interconnect 16, downwardly projected convex portions 16a are formed.

Subsequently, in the step shown in FIG. 3B, a silicon nitride film 24 with a thickness of about 0.2 μm is formed on the lower interlayer dielectric film 11, and an upper interlayer dielectric film 17 formed of a BPSG film with a thickness of about 1 μm is deposited on the silicon nitride film 24. Thereafter, a lithography and dry etching process is performed to form a connection hole 18 that passes through the upper interlayer dielectric film 17 and reaches the copper film 15 of the lower interconnect 16, and then an upper interconnect groove 19 is formed in a region of the upper interlayer dielectric film 17, including the connection hole 18, by performing a lithography and dry etching process. By forming the silicon nitride film 24 so that it covers the copper film 15 of the lower interconnect 16, oxidation of the copper film 15 can be prevented.

Next, in the step shown in FIG. 3C, a sputtering process, for example, is performed to deposit an upper barrier metal layer 20 having a thickness of 50 nm and made of TaN across the wall surfaces of the connection hole 18 and the upper interconnect groove 19 and the upper surface of the upper interlayer dielectric film 17. Subsequently, a copper film 21 is deposited on the upper barrier metal layer 20 by a sputtering process, a CVD process, an electroplating process or the like until the copper film 21 is filled in the connection hole 18 and the upper interconnect groove 19. If an electroplating process is performed, a seed layer made of the same material as the interconnect material (which is copper in the present embodiment) is formed.

Thereafter, a CMP process is performed to partially remove the copper film 21 and the upper barrier metal layer 20 until the upper surface of the upper interlayer dielectric film 17 is exposed, thus obtaining the structure of the semiconductor device shown in FIG. 1.

According to the semiconductor device fabricating method of the present embodiment, the lower interconnect 16 having the convex portions 16a at its bottom surface can be easily formed. Besides, in this structure, the convex portions 16a have the function of gettering voids. Therefore, it becomes possible to suppress an increase in contact resistance caused by concentrative gettering of voids in a region of the lower interconnect 16 (within the copper film 15) in contact with the upper plug 22a.

In the steps shown in FIGS. 2B and 2C, if etching is carried out by using a lattice-shaped resist film Re1 as a mask, lattice-shaped convex portions are formed in the lower interlayer dielectric film 11, and therefore, grooves (or concave portions) having shapes corresponding to those of the lattice-shaped convex portions are formed in the lower interconnect 16. Even in that case, voids are gettered due to stress generated in the concave portions of the lower interconnect 16, thus achieving the same effects as those of the present embodiment. The same holds true with regard to the fourth embodiment described later.

Second Embodiment

Figure 4:
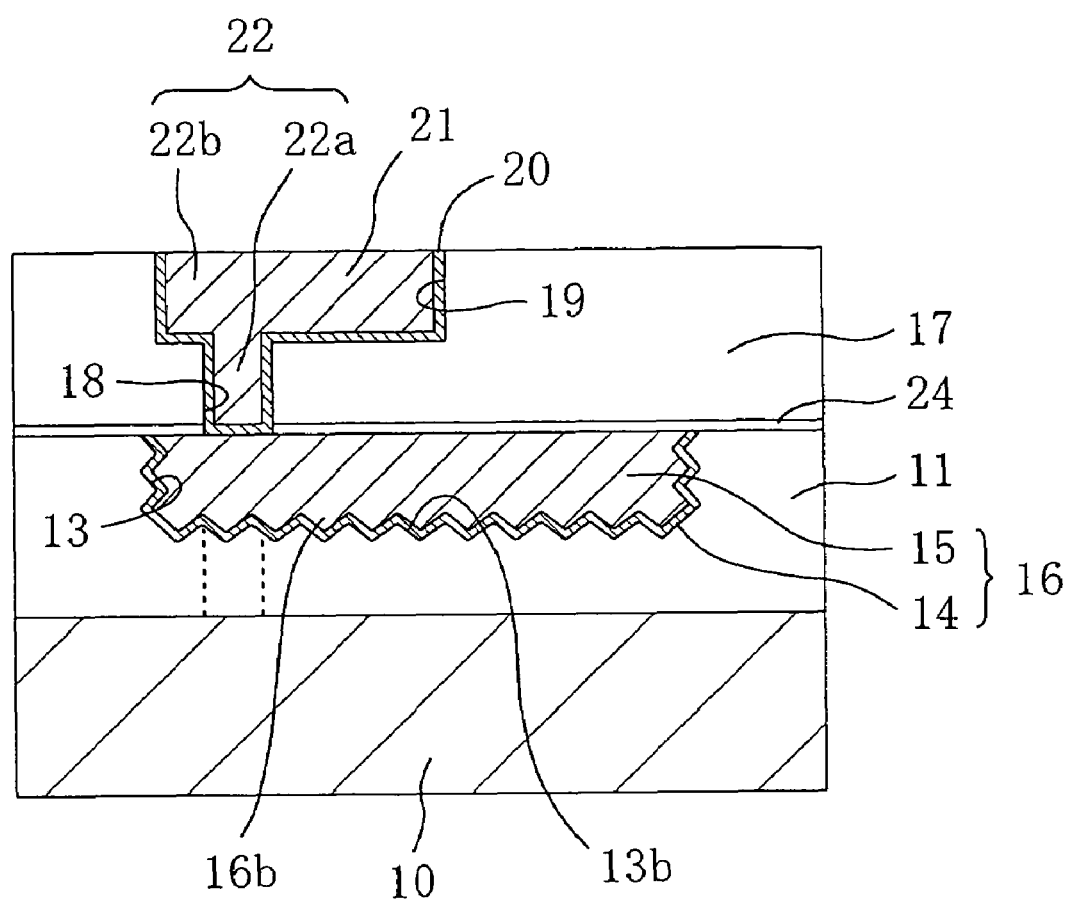
FIG. 4 is a cross-sectional view illustrating the structure of a semiconductor device according to a second embodiment of the present invention.

FIG. 4 is a cross-sectional view illustrating the structure of a semiconductor device according to a second embodiment of the present invention. As shown in FIG. 4, the semiconductor device of the present embodiment includes: a substrate 10 on which semiconductor elements (not shown) such as a large number of transistors are formed; a lower interlayer dielectric film 11 provided on the substrate 10; a lower interconnect groove 13 formed in the lower interlayer dielectric film 11; a lower barrier metal layer 14 formed along a wall surface of the lower interconnect groove 13; a copper film 15 for filling the lower interconnect groove 13; a silicon nitride film 24 provided on the lower interlayer dielectric film 11 and on the copper film 15; an upper interlayer dielectric film 17 provided on the silicon nitride film 24; a connection hole 18 formed in the upper interlayer dielectric film 17 and an upper interconnect groove 19 formed thereon; an upper barrier metal layer 20 formed along wall surfaces of the connection hole 18 and the upper interconnect groove 19; and a copper film 21 for filling the connection hole 18 and the upper interconnect groove 19. A lower interconnect 16 is made up of the copper film 15 and the lower barrier metal layer 14 which fill the lower interconnect groove 13. On the other hand, the upper interconnect groove 19 is formed in an extensive region of the upper interlayer dielectric film 17 including the connection hole 18. Further, portions of the upper barrier metal layer 20 and the copper film 21 filled in the connection hole 18 constitute an upper plug 22a, while another portions of the upper barrier metal layer 20 and the copper film 21 filled in the upper interconnect groove 19 constitute an upper interconnect 22b. The upper plug 22a passes through the silicon nitride film 24 and comes into contact with the copper film 15 of the lower interconnect 16. The upper plug 22a and the upper interconnect 22b constitute an upper interconnect layer 22.

The semiconductor device of the present embodiment is characterized in that wall surfaces (i.e., bottom and side surfaces) of the lower interconnect groove 13, formed in the lower interlayer dielectric film 11, are not flat, but have irregular-shaped concave and convex portions 13b, and the lower interconnect 16 has concave and convex portions 16b having irregular shapes corresponding to the shapes of the concave and convex portions 13b. Specifically, a plurality of concave portions exist in the concave and convex portions 13b of the lower interconnect groove 13, and a plurality of convex portions exist in the concave and convex portions 16b of the lower interconnect 16. Herein, "irregular shapes" mean random shapes that are not identical for each interconnect of each semiconductor device.

Also in the present embodiment, the thickness and planar size of the lower interconnect 16 are similar to those of the lower interconnect 16 of the first embodiment. In the conventional structure, it is known that if the lower interconnect groove 13 has a width equal to or greater than 0.25 μm and a length equal to or greater than 1 μm, a void concentration region is likely to be formed, in particular, in the lower interconnect 16.

The present embodiment is applicable to the substrate 10 even if another lower interlayer dielectric film and/or interconnect layer are/is further provided. In the present embodiment, as indicated by the broken lines in FIG. 4, another lower interconnect and/or another plug that reaches the semiconductor substrate are/is further provided below the lower interconnect 16. In general, the semiconductor device is often provided with three or more interconnect layers;

however, each of these interconnect layers preferably has the shape of the lower interconnect 16 described in the present embodiment.

In the semiconductor device of the present embodiment, the lower interconnect 16 is provided with the concave and convex portions 16b, and thus voids are also gettered by the concave and convex portions 16b. Therefore, it becomes possible to prevent voids from being concentratedly gettered in a region of the lower interconnect 16 in contact with the upper plug 22a. Thus, it is presumed that the concave and convex portions 16b achieve the function of gettering voids because stress is generated in the concave and convex portions 16b.

Hereinafter, a method for fabricating the semiconductor device according to the present embodiment will be described. FIGS. 5A through 5D are cross-sectional views illustrating the process for fabricating the semiconductor device of the present embodiment.

Figure 5A:
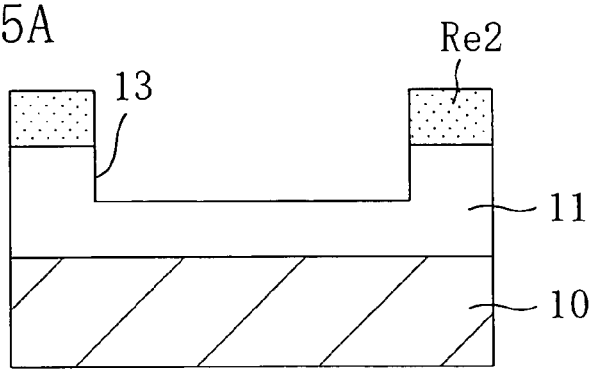
FIGS. 5A through 5D are cross-sectional views illustrating the process for fabricating the semiconductor device of the second embodiment.

First, in the step shown in FIG. 5A, a lower interlayer dielectric film 11 formed of a BPSG film with a thickness of about 1 µm is deposited on a substrate 10, and thereafter a resist film Re2 is formed by a known lithography process. Then, dry etching is performed using the resist film Re2 as a mask, thus forming a lower interconnect groove 13 in the lower interlayer dielectric film 11. In this case, the dry etching is performed using $CF_4$ and $CHF_3$ as an etching gas at a gas pressure of 133 pa and an RF power of 1 kw. Thus, after the etching has been finished, there remains a fluorocarbon film deposited nonuniformly on the wall surface of the lower interconnect groove 13. The depth and planar size of the lower interconnect groove 13 may be the same as those of the lower interconnect groove 13 in the step shown in FIG. 2A according to the first embodiment.

Figure 5B:
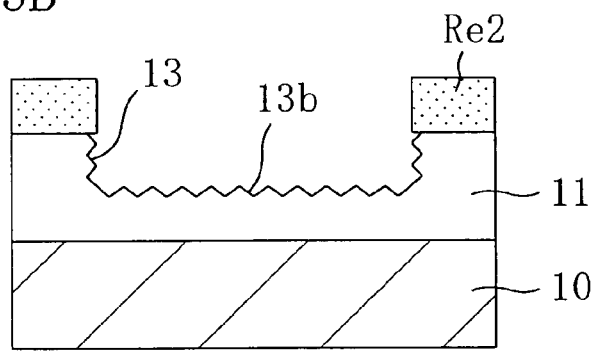

Next, in the step shown in FIG. 5B, wet etching is performed using a hydrofluoric acid-based etchant (such as HF or BHF), with the fluorocarbon film that has a non-uniform thickness remaining on the wall surface of the lower interconnect groove 13. Thus, concave and convex portions 13b are formed at the wall surface of the lower interconnect groove 13. Alternatively, the fluorocarbon film (deposition film) may be partially removed by oxygen plasma to partially expose the lower interlayer dielectric film 11, and then wet etching may be performed using a hydrofluoric acid-based etchant.

Subsequently, in the step shown in FIG. 5C, a sputtering process, for example, is performed to deposit, on the lower interlayer dielectric film 11, a lower barrier metal layer 14 formed of a TaN film with a thickness of about 50 nm, and then a copper film 15 is formed on the lower barrier metal layer 14 by a sputtering process, a CVD process, an electroplating process or the like until the copper film 15 is filled in the lower interconnect groove 13. If an electroplating process is performed, a seed layer made of the same material as the interconnect material (which is copper in the present embodiment) is formed. The TaN film has the function of suppressing diffusion of copper atoms.

Figure 5C:
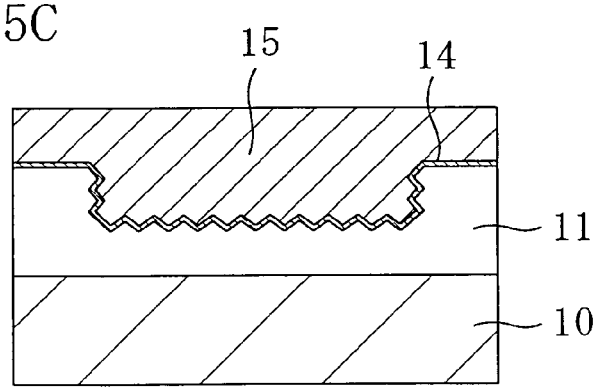
Figure 5D:
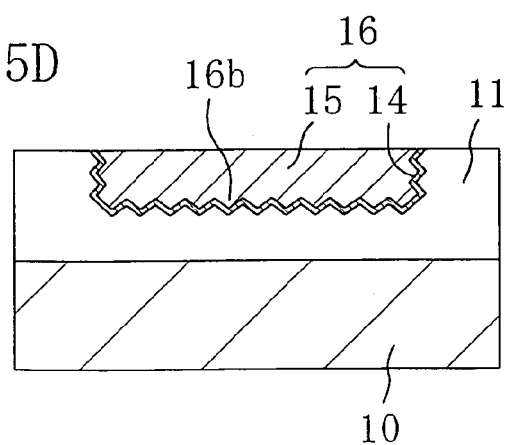

Thereafter, in the step shown in FIG. 5D, the copper film 15 and the lower barrier metal layer 14 are partially removed by a CMP process until the upper surface of the lower interlayer dielectric film 11 is exposed. Thus, a lower interconnect 16 made up of the copper film 15 and the lower barrier metal layer 14 is formed. Further, at the bottom and side surfaces of the lower interconnect 16, irregular-shaped concave and convex portions 16b are formed.

Although the subsequent steps are not shown, the steps similar to those shown in FIGS. 3B and 3C according to the first embodiment are carried out, thus obtaining the structure of the semiconductor device shown in FIG. 4.

According to the semiconductor device fabricating method of the present embodiment, when the concave and convex portions 13b are formed at the lower interconnect groove 13, it is possible to easily form the lower interconnect 16 having the irregular-shaped concave and convex portions 16b at its bottom surface, without adding a lithography process performed in the first embodiment. Besides, in this structure, the concave and convex portions 16b have the function of gettering voids. Therefore, it becomes possible to suppress an increase in contact resistance caused by concentrative gettering of voids in a region of the lower interconnect 16 (within the copper film 15) in contact with the upper plug 22a.

Third Embodiment

Figure 6:
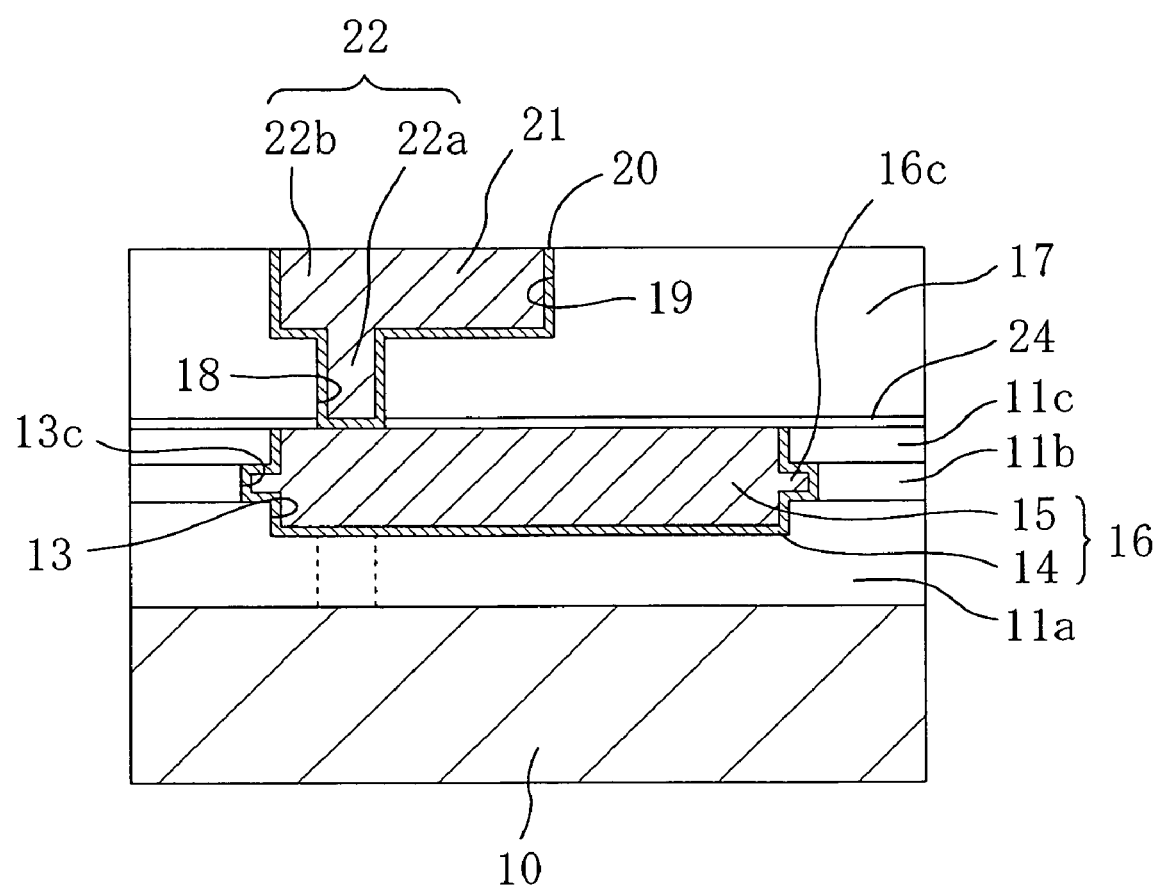
FIG. 6 is a cross-sectional view illustrating the structure of a semiconductor device according to a third embodiment of the present invention.

FIG. 6 is a cross-sectional view illustrating the structure of a semiconductor device according to a third embodiment of the present invention. As shown in FIG. 6, the semiconductor device of the present embodiment includes: a substrate 10 on which semiconductor elements (not shown) such as a large number of transistors are formed; a lower interlayer dielectric film 11 provided on the substrate 10 and consisting of a first layer 11a with a low etch rate, a second layer 11b with a high etch rate, and a third layer 11c with a low etch rate; a lower interconnect groove 13 formed in the lower interlayer dielectric film 11; a lower barrier metal layer 14 formed along a wall surface of the lower interconnect groove 13; a copper film 15 for filling the lower interconnect groove 13; a silicon nitride film 24 provided on the lower interlayer dielectric film 11 and on the copper film 15; an upper interlayer dielectric film 17 provided on the silicon nitride film 24; a connection hole 18 formed in the upper interlayer dielectric film 17 and an upper interconnect groove 19 formed thereon; an upper barrier metal layer 20 formed along wall surfaces of the connection hole 18 and the upper interconnect groove 19; and a copper film 21 for filling the connection hole 18 and the upper interconnect groove 19. A lower interconnect 16 is made up of the copper film 15 and the lower barrier metal layer 14 which fill the lower interconnect groove 13. On the other hand, the upper interconnect groove 19 is formed in an extensive region of the upper interlayer dielectric film 17 including the connection hole 18. Further, portions of the upper barrier metal layer 20 and the copper film 21 filled in the connection hole 18 constitute an upper plug 22a, while another portions of the upper barrier metal layer 20 and the copper film 21 filled in the upper interconnect groove 19 constitute an upper interconnect 22b. The upper plug 22a passes through the silicon nitride film 24 and comes into contact with the copper film 15 of the lower interconnect 16. The upper plug 22a and the upper interconnect 22b constitute an upper interconnect layer 22.

The semiconductor device of the present embodiment is characterized in that side surfaces of the lower interconnect groove 13, formed in the lower interlayer dielectric film 11, are not flat, but side surfaces of the second layer 11b have concave portions 13c located outwardly of side surfaces of the first layer 11a and the third layer 11c, and the lower interconnect 16 has convex portions 16c buried in the concave portions 13c. Also in the present embodiment, the thickness and planar size of the lower interconnect 16 are similar to those of the lower interconnect 16 of the first embodiment. Furthermore, the convex portions 16c each have a longitudinal size of about 0.1 µm and a projection of about 0.1 µm. In the conventional structure, it is known that if the lower interconnect groove 13 has a width equal to or greater than 0.25 µm and a length equal to or greater than 1 µm, a void concentration region is likely to be formed, in particular, in the lower interconnect 16.

The present embodiment is applicable to the substrate 10 even if another lower interlayer dielectric film and/or interconnect layer are/is further provided. In the present embodiment, as indicated by the broken lines in FIG. 6, another lower interconnect and/or another plug that reaches the semiconductor substrate are/is further provided below the lower interconnect 16. In general, the semiconductor device is often provided with three or more interconnect layers; however, each of these interconnect layers preferably has the shape of the lower interconnect 16 described in the present embodiment.

In the semiconductor device of the present embodiment, the lower interconnect 16 is provided at its side surfaces with the convex portions 16c, and thus voids are also gettered by the convex portions 16c. Therefore, it becomes possible to prevent voids from being concentratedly gettered in a region of the lower interconnect 16 in contact with the upper plug 22a. Thus, it is presumed that the convex portions 16c achieve the function of gettering voids because stress is generated in the convex portions 16c.

Unlike the present embodiment, if the second layer 11b is made of an insulating material with an etch rate lower than that of each of the first layer 11a and the third layer 11c, concave portions are to be formed at the side surfaces of the lower interconnect groove 13. However, even in such a case, voids can be gettered due to stress generated around the concave portions, and therefore, the effects similar to those of the present embodiment can be achieved. The same holds true with regard to the fourth embodiment described later.

The third layer 11c with a low etch rate does not necessarily have to be provided on the second layer 11b made of a material with a high etch rate. Alternatively, the lower interlayer dielectric film 11 may only consist of the first layer 11a and the second layer 11b. Even in such a case, since concave or convex portions are formed at the side surfaces of the lower interconnect groove 13, stress is generated in convex or concave portions of the lower interconnect 16 having shapes corresponding to those of the concave or convex portions at the side surfaces of the lower interconnect groove 13, thus achieving the effects of the present embodiment. The same holds true with regard to the fourth embodiment described later.

Hereinafter, a method for fabricating the semiconductor device according to the present embodiment will be described. FIGS. 7A through 7D are cross-sectional views illustrating the process for fabricating the semiconductor device of the present embodiment.

Figure 7A:
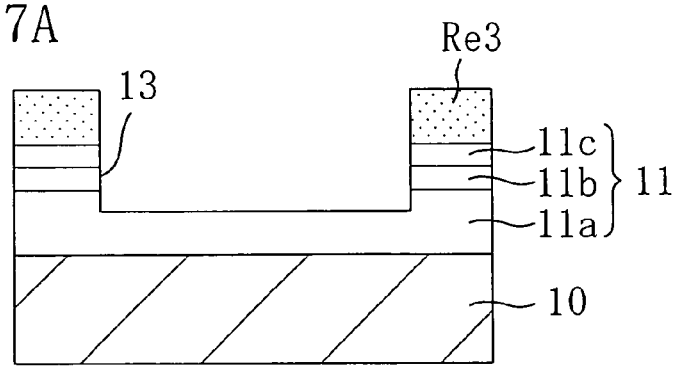
FIGS. 7A through 7D are cross-sectional views illustrating the process for fabricating the semiconductor device of the third embodiment.

First, in the step shown in FIG. 7A, a lower interlayer dielectric film 11 consisting of: a first layer 11a formed of a PSG film with a thickness of about 0.8 µm; a second layer 11b formed of an NSG film with a thickness of about 0.1 µm; and a third layer 11c formed of a PSG film with a thickness of about 0.1 µm is deposited on a substrate 10, and thereafter a resist film Re3 is formed by a known lithography process. Then, dry etching is performed using the resist film Re3 as a mask, thus forming a lower interconnect groove 13 in the lower interlayer dielectric film 11. The depth and planar size of the lower interconnect groove 13 may be the same as those of the lower interconnect groove 13 in the step shown in FIG. 2A according to the first embodiment.

Figure 7B:
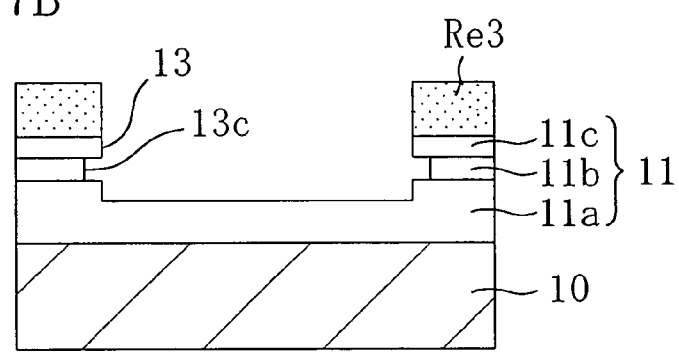

Next, in the step shown in FIG. 7B, wet etching is performed using a hydrofluoric acid-based etchant (such as HF or BHF), thus forming, at the side surfaces of the lower interconnect groove 13, concave portions 13c each having a lateral depth of about 0.1 µm. The present embodiment utilizes the fact that the etch rate of an NSG film is higher than that of a PSG film when a hydrofluoric acid-based etchant is used for wet etching.

The combination of materials for the first, second and third layers 11a, 11b and 11c of the lower interlayer dielectric film 11 may be changed as follows. The lower interlayer dielectric film 11 may consist of: the first and third layers 11a and 11c each formed of an $SiO_2$ film; and the second layer 11b formed of an SiON film, and this lower interlayer dielectric film 11 may be wet-etched using a hydrofluoric acid-based etchant. The same holds true with regard to the fourth embodiment described later.

Figure 7C:
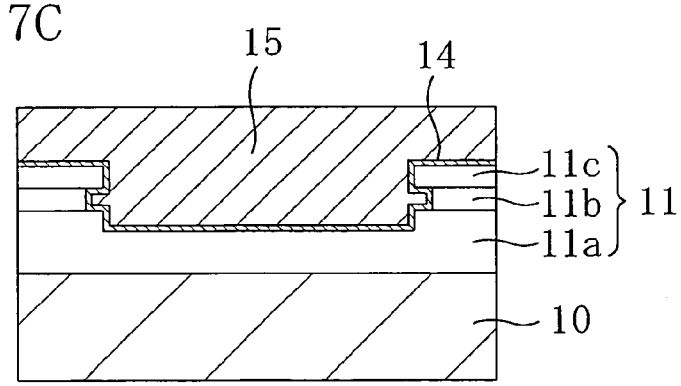

Subsequently, in the step shown in FIG. 7C, a sputtering process, for example, is performed to deposit, on the lower interlayer dielectric film 11, a lower barrier metal layer 14 formed of a TaN film with a thickness of about 50 nm, and then a copper film 15 is formed on the lower barrier metal layer 14 by a sputtering process, a CVD process, an electroplating process or the like until the copper film 15 is filled in the lower interconnect groove 13. If an electroplating process is performed, a seed layer made of the same material as the interconnect material (which is copper in the present embodiment) is formed. The TaN film has the function of suppressing diffusion of copper atoms.

Figure 7D:
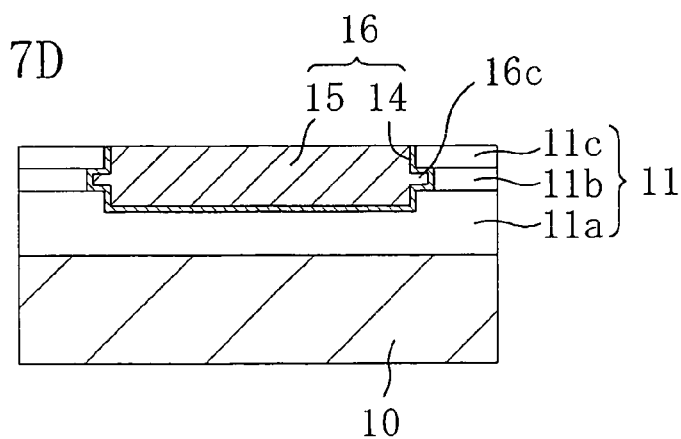

Thereafter, in the step shown in FIG. 7D, the copper film 15 and the lower barrier metal layer 14 are partially removed by a CMP process until the upper surface of the lower interlayer dielectric film 11 is exposed. Thus, a lower interconnect 16 made up of the copper film 15 and the lower barrier metal layer 14 is formed. Further, at the side surfaces of the lower interconnect 16, laterally projected convex portions 16c are formed.

Although the subsequent steps are not shown, the steps similar to those shown in FIGS. 3B and 3C according to the first embodiment are carried out, thus obtaining the structure of the semiconductor device shown in FIG. 6.

According to the semiconductor device fabricating method of the present embodiment, when the concave portions 13c are formed at the lower interconnect groove 13, it is possible to easily form the lower interconnect 16 having the convex portions 16c at its side surfaces, without adding a lithography process performed in the first embodiment. Besides, in this structure, the convex portions 16c have the function of gettering voids. Therefore, it becomes possible to suppress an increase in contact resistance caused by concentrative gettering of voids in a region of the lower interconnect 16 (within the copper film 15) in contact with the upper plug 22a.

In the present embodiment, the lower interlayer dielectric film 11 consists of two kinds of insulating films having mutually different etch rates. Alternatively, the lower interlayer dielectric film 11 may consist of three or more kinds of insulating films.

Fourth Embodiment

Figure 8:
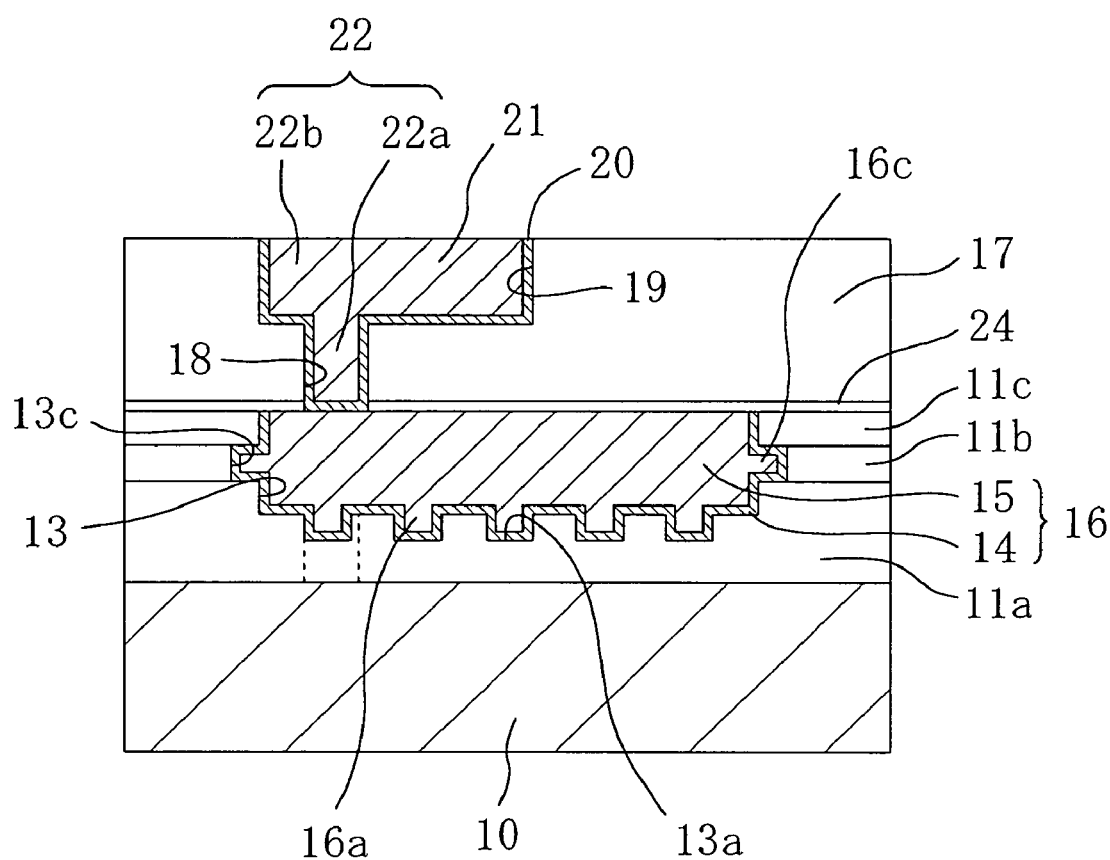
FIG. 8 is a cross-sectional view illustrating the structure of a semiconductor device according to a fourth embodiment of the present invention.

FIG. 8 is a cross-sectional view illustrating the structure of a semiconductor device according to the fourth embodiment of the present invention. As shown in FIG. 8, the basic structure of the semiconductor device according to the present embodiment is the same as that of the semiconductor device according to the first through third embodiments. However, the semiconductor device of the fourth embodiment is characterized by having the features of both the first embodiment and the third embodiment.

Specifically, the lower surface of a lower interconnect groove 13 formed in a lower interlayer dielectric film 11 is not flat, but has many concave portions 13a, and a lower interconnect 16 has regular-shaped convex portions 16a buried in the concave portions 13a. The concave portions 13a each have a depth of 0.1 µm, for example, and a planar size of 0.2 µm×0.2 µm, for example.

Furthermore, the side surfaces of the lower interconnect groove 13 formed in the lower interlayer dielectric film 11 are not flat, but have concave portions 13c, and the lower interconnect 16 has convex portions 16c buried in the concave portions 13c. The convex portions 16c each have a longitudinal size of about 0.1 µm, and a projection of about 0.1 µm.

Also in the present embodiment, the thickness and planar size of the lower interconnect 16 are similar to those of the lower interconnect 16 according to the first embodiment. An upper plug 22a has a planar size of 0.2 µm×0.2 µm, for example. In the conventional structure, it is known that if the lower interconnect groove 13 has a width equal to or greater than 0.25 µm and a length equal to or greater than 1 µm, a void concentration region is likely to be formed, in particular, in the lower interconnect 16.

The present embodiment is applicable to a substrate 10 even if another lower interlayer dielectric film and/or interconnect layer are/is further provided. In the present embodiment, as indicated by the broken lines in FIG. 8, another lower interconnect and/or another plug that reaches the semiconductor substrate are/is further provided below the lower interconnect 16. In general, the semiconductor device is often provided with three or more interconnect layers; however, each of these interconnect layers preferably has the shape of the lower interconnect 16 described in the present embodiment.

In the semiconductor device of the present embodiment, the lower interconnect 16 is provided, at its bottom and side surfaces, with the convex portions 16a and 16c, respectively, and thus voids are also gettered by the convex portions 16a and 16c. Therefore, it becomes possible to prevent voids from being concentratedly gettered in a region of the lower interconnect 16 in contact with the upper plug 22a. Accordingly, it becomes possible to achieve the function of distributing the regions where voids are gettered, which is better than that achieved by the structure of the first embodiment or the third embodiment.

Hereinafter, a method for fabricating the semiconductor device of the fourth embodiment will be described. FIGS. 9A through 9D are cross-sectional views illustrating the process for fabricating the semiconductor device of the present embodiment.

Figure 9A:
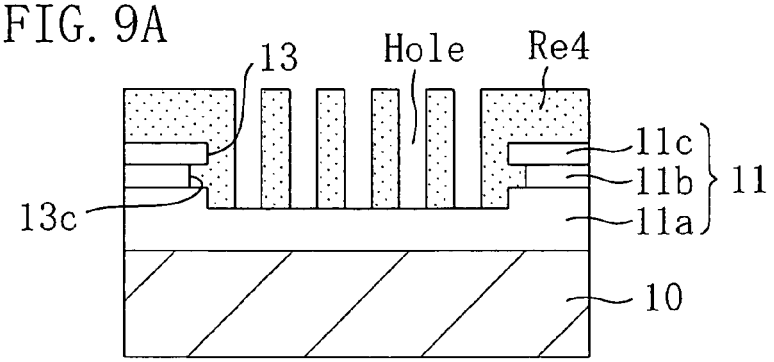
FIGS. 9A through 9D are cross-sectional views illustrating the process for fabricating the semiconductor device of the fourth embodiment.

First, in the step shown in FIG. 9A, the steps similar to those shown in FIGS. 7A and 7B according to the third embodiment are carried out, thus forming concave portions 13c at side surfaces of a lower interconnect groove 13 in a lower interlayer dielectric film 11. Furthermore, a lithography process is performed to form, on the lower interlayer dielectric film 11, a resist film Re4 having a large number of openings Hole. In this case, the planar size, the number, the location and the like of the openings Hole are similar to those of the openings Hole shown in the left part and the right part of FIG. 2B according to the first embodiment.

Figure 9B:
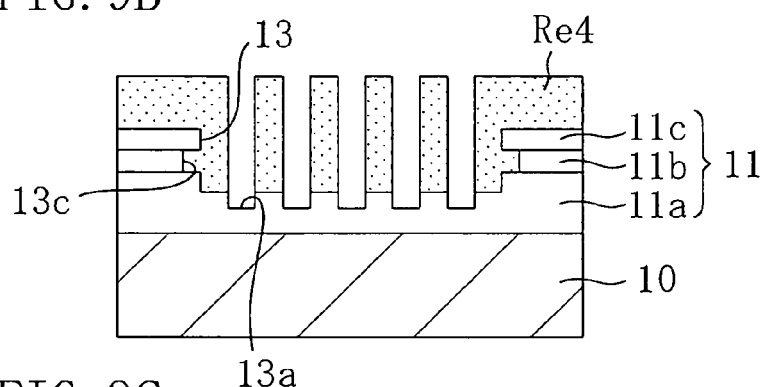

Next, in the step shown in FIG. 9B, a dry etching process is performed to remove portions of the lower interlayer dielectric film 11 located below the openings Hole of the resist film Re4, thus forming concave portions 13a at the bottom surface of the lower interconnect groove 13. In this case, the depth of each concave portion 13a is the same as that of each concave portion 13a according to the first embodiment.

Figure 9C:
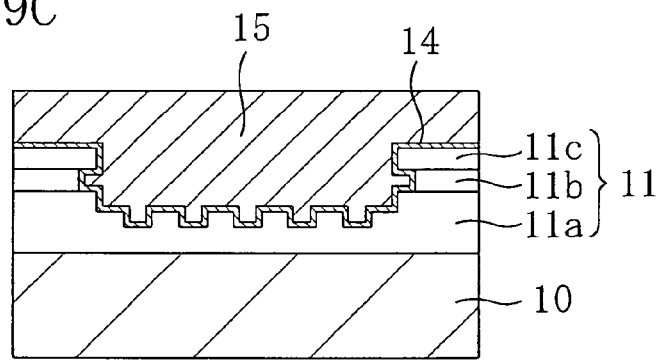

Subsequently, in the step shown in FIG. 9C, an ashing process is performed to remove the resist film Re4, and then a sputtering process, for example, is performed to deposit, on the lower interlayer dielectric film 11, a lower barrier metal layer 14 formed of a TaN film with a thickness of about 50 nm. Thereafter, a copper film 15 is formed on the lower barrier metal layer 14 by a sputtering process, a CVD process, an electroplating process or the like until the copper film 15 is filled in the lower interconnect groove 13. If an electroplating process is performed, a seed layer made of the same material as the interconnect material (which is copper in the present embodiment) is formed. The TaN film has the function of suppressing diffusion of copper atoms.

Figure 9D:
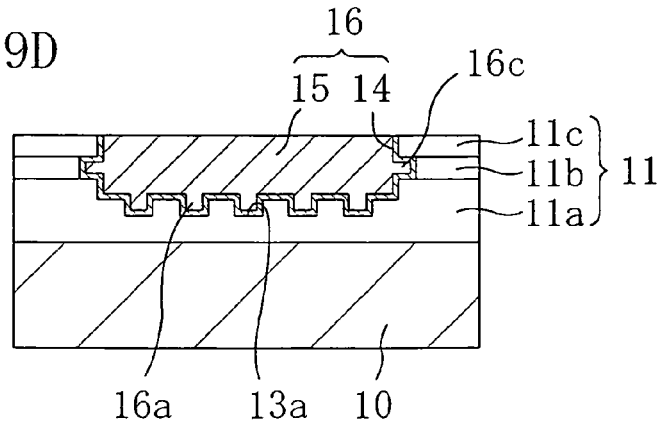

Then, in the step shown in FIG. 9D, the copper film 15 and the lower barrier metal layer 14 are partially removed by a CMP process until the upper surface of the lower interlayer dielectric film 11 is exposed. Thus, a lower interconnect 16 made up of the copper film 15 and the lower barrier metal layer 14 is formed. Furthermore, downwardly projected convex portions 16a and laterally projected convex portions 16c are formed at the bottom and side surfaces of the lower interconnect 16, respectively.

Although the subsequent steps are not shown, the steps similar to those shown in FIGS. 3B and 3C according to the first embodiment are carried out, thus obtaining the structure of the semiconductor device shown in FIG. 8.

According to the semiconductor device fabricating method of the present embodiment, it is possible to easily form the lower interconnect 16 having the convex portions 16a and 16c at its bottom and side surfaces, respectively. Besides, in this structure, the convex portions 16a and 16c have the function of gettering voids. Therefore, it becomes possible to more effectively suppress an increase in contact resistance caused by concentrative gettering of voids in a region of the lower interconnect 16 (within the copper film 15) in contact with the upper plug 22a.

Fifth Embodiment

Figure 10:
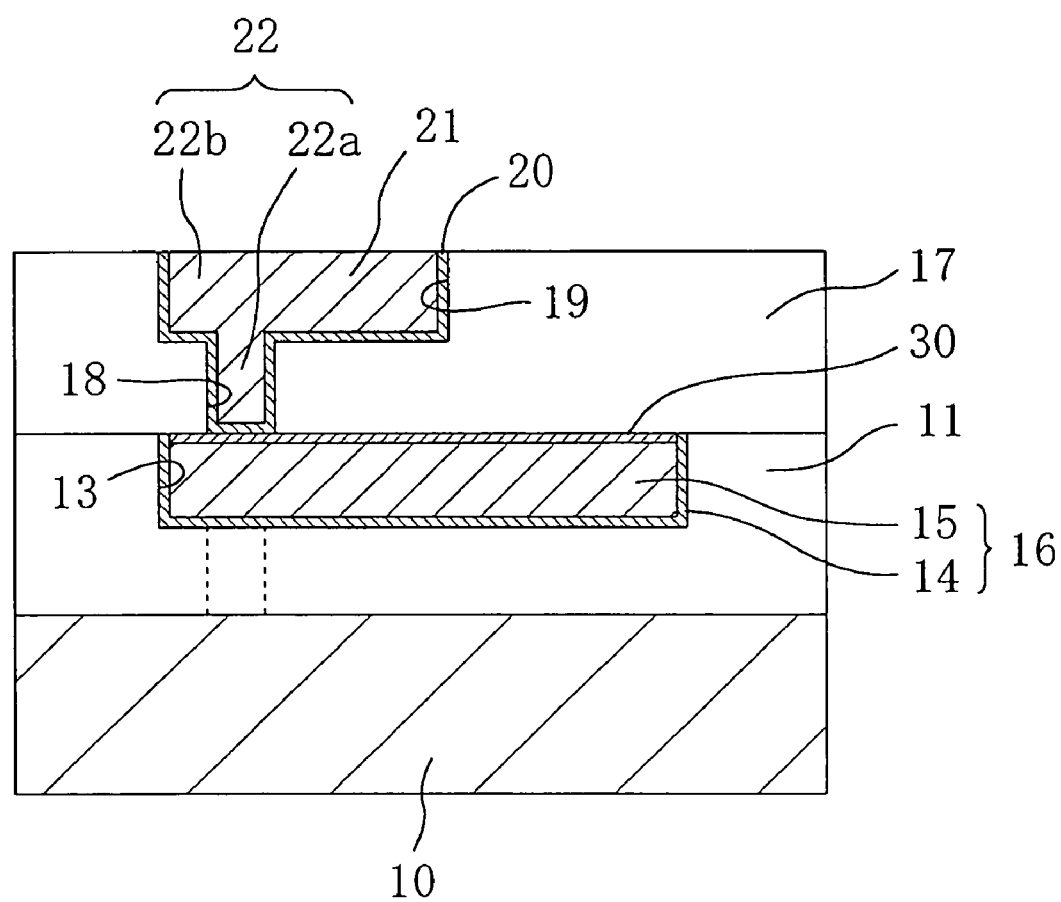
FIG. 10 is a cross-sectional view illustrating the structure of a semiconductor device according to a fifth embodiment of the present invention.

FIG. 10 is a cross-sectional view illustrating the structure of a semiconductor device according to a fifth embodiment of the present invention. As shown in FIG. 10, the semiconductor device of the present embodiment includes: a substrate 10 on which semiconductor elements (not shown) such as a large number of transistors are formed; a lower interlayer dielectric film 11 provided on the substrate 10; a lower interconnect groove 13 formed in the lower interlayer dielectric film 11; a lower barrier metal layer 14 formed along a wall surface of the lower interconnect groove 13; a copper film 15 for filling the lower interconnect groove 13; a barrier metal layer 30 formed on the copper film 15; an upper interlayer dielectric film 17 provided on the lower interlayer dielectric film 11 and on the barrier metal layer 30; a connection hole 18 formed in the upper interlayer dielectric film 17 and an upper interconnect groove 19 formed thereon; an upper barrier metal layer 20 formed along wall surfaces of the connection hole 18 and the upper interconnect groove 19; and a copper film 21 for filling the connection hole 18 and the upper interconnect groove 19. A lower interconnect 16 is made up of the copper film 15 and the lower barrier metal layer 14 which fill the lower interconnect groove 13. On the other hand, the upper interconnect groove 19 is formed in an extensive region of the upper interlayer dielectric film 17 including the connection hole 18. Further, portions of the upper barrier metal layer 20 and the copper film 21 filled in the connection hole 18 constitute an upper plug 22a, while another portions of the upper barrier metal layer 20 and the copper film 21 filled in the upper interconnect groove 19 constitute an upper interconnect 22b. The upper plug 22a and the upper interconnect 22b constitute an upper interconnect layer 22. Alternatively, as in the first through fourth embodiments, a silicon nitride film may be formed on the lower interlayer dielectric film 11 and the barrier metal layer 30, and the upper interlayer dielectric film 17 may be formed on the silicon nitride film.

The semiconductor device of the present embodiment is characterized in that the barrier metal layer 30 which is a stress-relieving conductor film made of TaN and having a thickness of 50 nm is provided between the copper film 15 of the lower interconnect 16 and the upper plug 22a. Furthermore, the barrier metal layer 30 is formed on the copper film 15 so as to be flush with the upper surface of the lower interlayer dielectric film 11. The barrier metal layer 30 has the function of preventing oxidation of the copper film 15 in the lower interconnect 16, and the function of relieving stress in the contact area between the copper film 15 and the upper plug 22a.

Also in the present embodiment, the thickness and planar size of the lower interconnect 16 are similar to those of the lower interconnect 16 according to the first embodiment. In the conventional structure, it is known that if the lower interconnect groove 13 has a width equal to or greater than 0.25 µm and a length equal to or greater than 1 µm, a void concentration region is likely to be formed, in particular, in the lower interconnect 16.

The present embodiment is applicable to the substrate 10 even if another lower interlayer dielectric film and/or interconnect layer are/is further provided. In the present embodiment, as indicated by the broken lines in FIG. 10, another lower interconnect and/or another plug that reaches the semiconductor substrate are/is further provided below the lower interconnect 16. In general, the semiconductor device is often provided with three or more interconnect layers; however, each of these interconnect layers preferably has the shape of the lower interconnect 16 described in the present embodiment.

In the semiconductor device of the present embodiment, the barrier metal layer 30 for covering the copper film 15 of the lower interconnect 16 is provided, thus relieving localized stress in the contact area between the lower interconnect 16 and the upper plug 22a. Accordingly, it becomes possible to prevent voids from being concentratedly gettered in a region of the lower interconnect 16 in contact with the upper plug 22a.

Hereinafter, a method for fabricating the semiconductor device according to the present embodiment will be described. FIGS. 11A through 11D are cross-sectional views illustrating the process for fabricating the semiconductor device of the present embodiment.

Figure 11A:
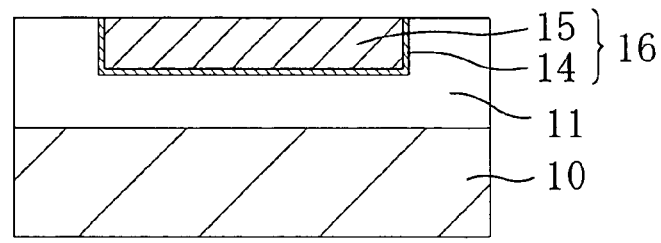
FIGS. 11A through 11D are cross-sectional views illustrating the process for fabricating the semiconductor device of the fifth embodiment.

First, in the step shown in FIG. 11A, the steps substantially similar to those shown in FIGS. 5A, 5C and 5D according to the second embodiment are carried out, thus forming a lower interlayer dielectric film 11 and a lower interconnect 16.

Figure 11B:
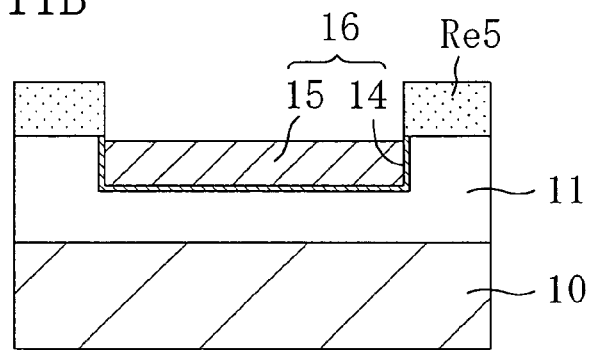

Next, in the step shown in FIG. 11B, a known lithography process is performed to form a resist film Re5 having an opening for exposing the upper surface of a copper film 15 in the lower interconnect 16. Then, the copper film 15 is dry-etched using the resist film Re5 as a mask, thus removing a portion of the copper film 15 to a depth of 50 nm. In this case, the lower interlayer dielectric film 11 and lower barrier metal layer 14 may also be partially removed at the same time.

Figure 11C:
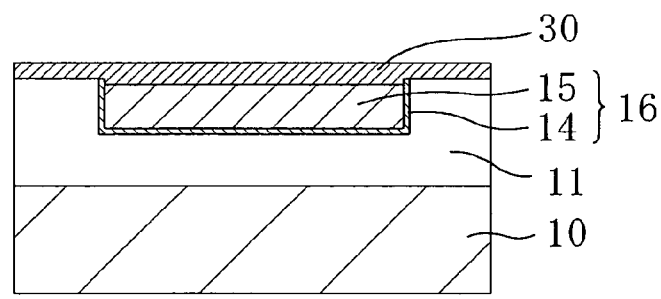

Subsequently, in the step shown in FIG. 11C, a barrier metal layer 30 formed of a TaN film with a thickness of 100 nm is deposited on the lower interconnect 16 (the lower barrier metal layer 14 and the copper film 15) and on the lower interlayer dielectric film 11 by a sputtering process, for example.

Figure 11D:
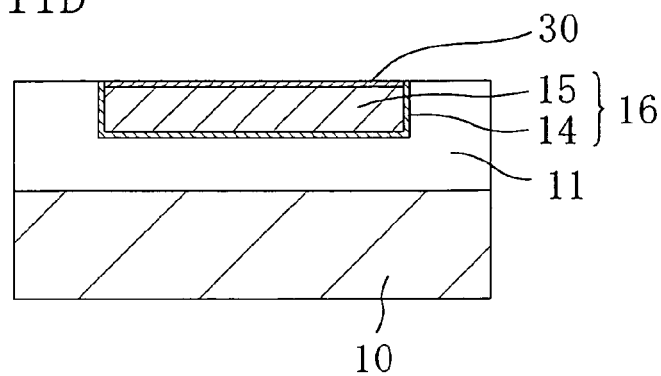

Thereafter, in the step shown in FIG. 11D, the barrier metal layer 30 is partially removed by a CMP process until the upper surface of the lower interlayer dielectric film 11 is exposed. Thus, the structure in which the barrier metal layer 30 is provided on the copper film 15 is obtained. Consequently, the barrier metal layer 30 is formed only in the removed region that has been etched in the step shown in FIG. 11B, and is thus formed mainly on the copper film 15.

Although the subsequent steps are not shown, the steps similar to those shown in FIGS. 3B and 3C according to the first embodiment are carried out, thus obtaining the structure of the semiconductor device shown in FIG. 10.

According to the semiconductor device fabricating method of the present embodiment, the structure in which the barrier metal layer 30 is provided on the copper film 15 is easily obtained. Besides, in this structure, it becomes possible to relieve stress in the contact area between the lower interconnect 16 (within the copper film 15) and the upper plug 22a, and thus it becomes possible to suppress an increase in contact resistance caused by concentrative gettering of voids in a region of the lower interconnect 16 (within the copper film 15) in contact with the upper plug 22a.

Alternatively, instead of the barrier metal layer 30 formed of a TaN film, the semiconductor device may be provided with a stress-relieving conductor film made of a conductor material that does not have the function of preventing the passage of oxygen, and a silicon nitride film may further be formed thereon. Even in such a case, the effects similar to those of the present embodiment can be achieved.

Sixth Embodiment

Figure 12:
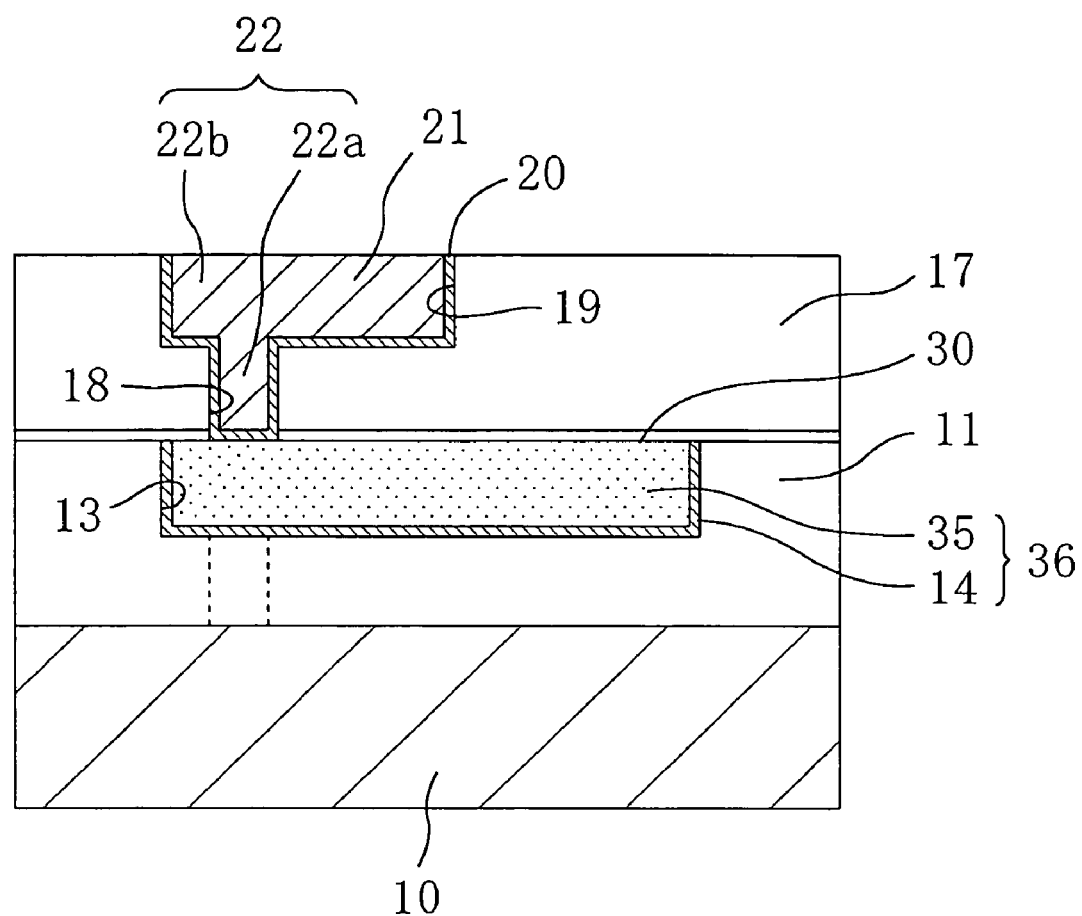
FIG. 12 is a cross-sectional view illustrating the structure of a semiconductor device according to a sixth embodiment of the present invention.

FIG. 12 is a cross-sectional view illustrating the structure of a semiconductor device according to a sixth embodiment of the present invention. As shown in FIG. 12, the semiconductor device of the present embodiment includes: a substrate 10 on which semiconductor elements (not shown) such as a large number of transistors are formed; a lower interlayer dielectric film 11 provided on the substrate 10; a lower interconnect groove 13 formed in the lower interlayer dielectric film 11; a lower barrier metal layer 14 formed along a wall surface of the lower interconnect groove 13; a Si-containing copper film 35 for filling the lower interconnect groove 13; a silicon nitride film 24 provided on the lower interlayer dielectric film 11 and on the Si-containing copper film 35; an upper interlayer dielectric film 17 provided on the silicon nitride film 24; a connection hole 18 formed in the upper interlayer dielectric film 17 and an upper interconnect groove 19 formed thereon; an upper barrier metal layer 20 formed along wall surfaces of the connection hole 18 and the upper interconnect groove 19; and a copper film 21 for filling the connection hole 18 and the upper interconnect groove 19. A lower interconnect 36 is made up of the Si-containing copper film 35 and the lower barrier metal layer 14 which fill the lower interconnect groove 13. On the other hand, the upper interconnect groove 19 is formed in an extensive region of the upper interlayer dielectric film 17 including the connection hole 18. Further, portions of the upper barrier metal layer 20 and the copper film 21 filled in the connection hole 18 constitute an upper plug 22a, while another portions of the upper barrier metal layer 20 and the copper film 21 filled in the upper interconnect groove 19 constitute an upper interconnect 22b. The upper plug 22a passes through the silicon nitride film 24 and comes into contact with the Si-containing copper film 35 of the lower interconnect 16. The upper plug 22a and the upper interconnect 22b constitute an upper interconnect layer 22.

The semiconductor device of the present embodiment is characterized in that the lower interconnect 36 has the Si-containing copper film 35. Also in the present embodiment, the thickness and planar size of the lower interconnect 36 are similar to those of the lower interconnect 16 according to the first embodiment.

The present embodiment is applicable to the substrate 10 even if another lower interlayer dielectric film and/or interconnect layer are/is further provided. In the present embodiment, as indicated by the broken lines in FIG. 12, another lower interconnect and/or another plug that reaches the semiconductor substrate are/is further provided below the lower interconnect 36. In general, the semiconductor device is often provided with three or more interconnect layers; however, each of these interconnect layers preferably has the structure of the lower interconnect 36 described in the present embodiment.

In the semiconductor device of the present embodiment, the lower interconnect 36 is provided with the Si-containing copper film 35, and thus voids are also gettered by the Si-containing copper film 35 in the lower interconnect 36. Therefore, it becomes possible to prevent voids from being concentratedly gettered in a region of the lower interconnect 36 in contact with the upper plug 22a.

Figure 13A:
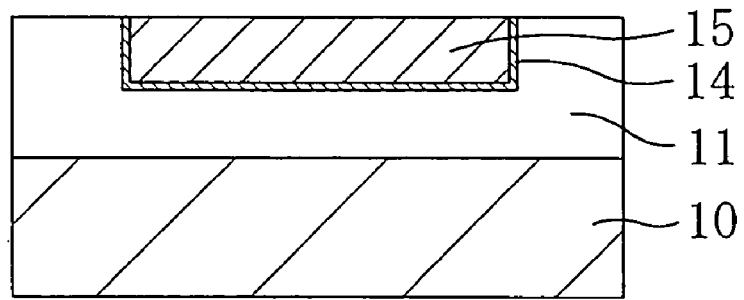
FIGS. 13A through 13C are cross-sectional views illustrating the process for fabricating the semiconductor device of the sixth embodiment.
Figure 13B:
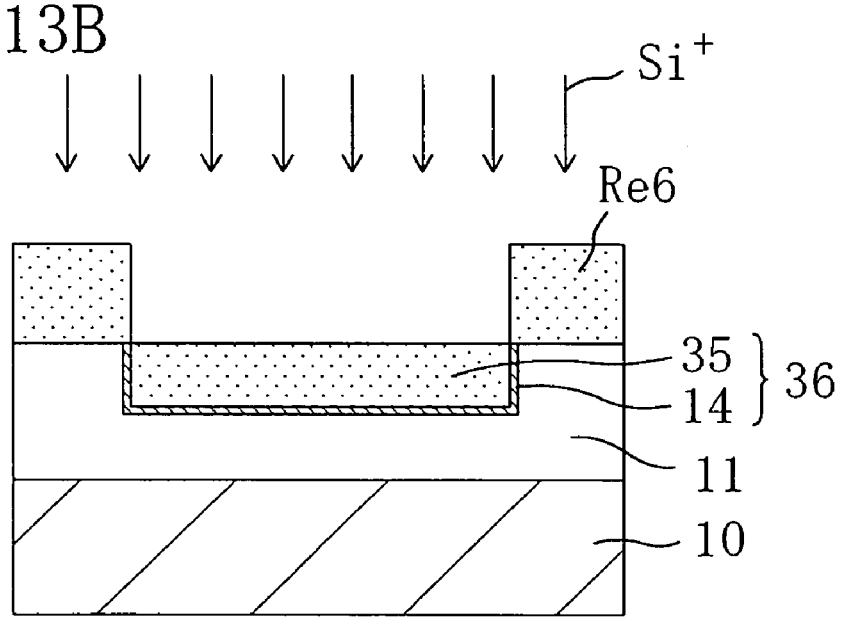
Figure 13C:
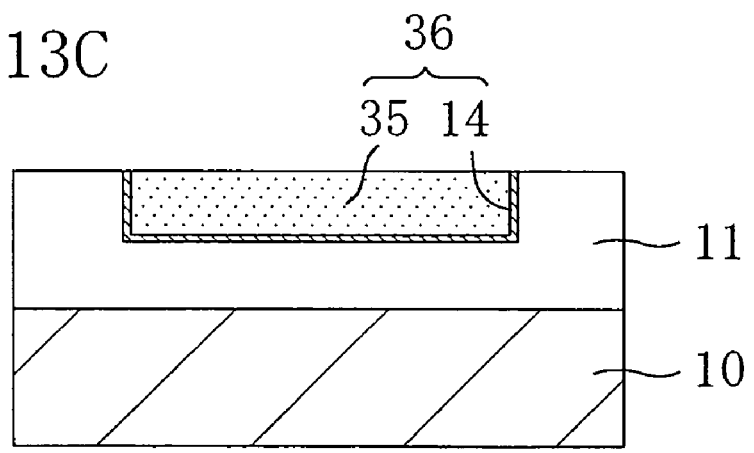
Figure 14:
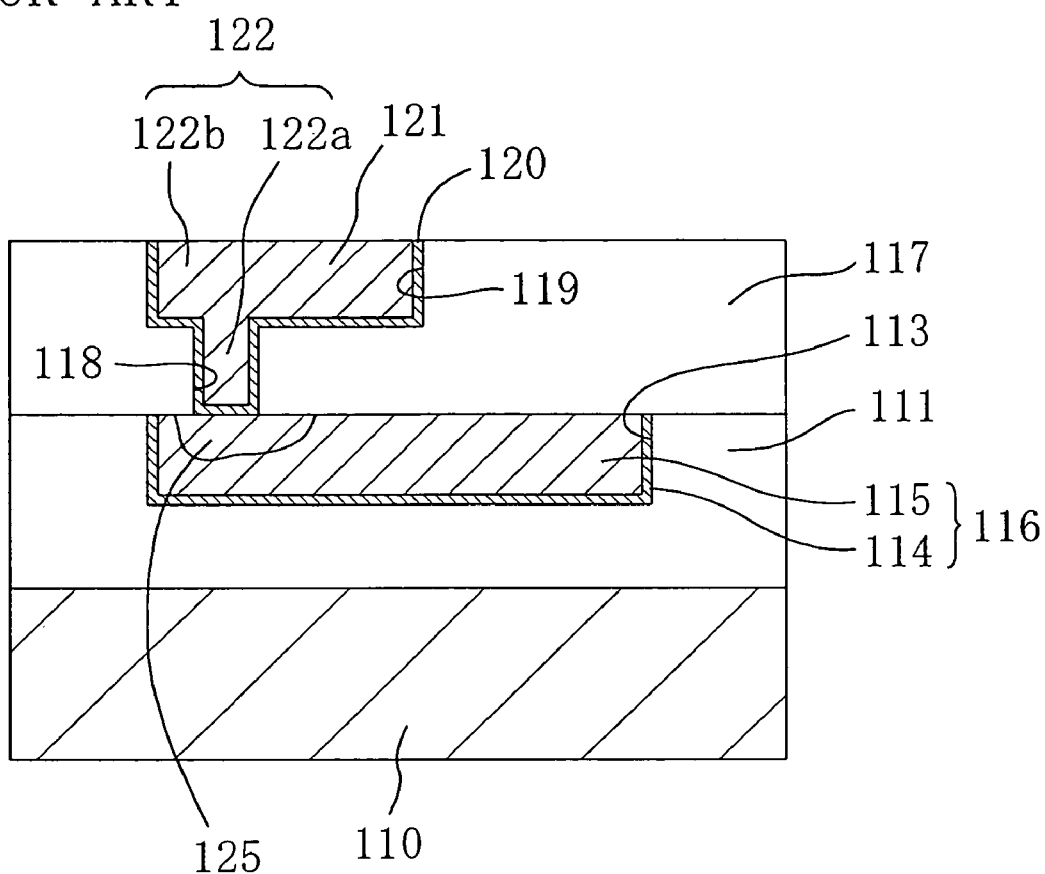
FIG. 14 is a cross-sectional view illustrating the structure of a conventional semiconductor device including interconnect layers formed by performing a dual damascene process.

Hereinafter, a method for fabricating the semiconductor device of the present embodiment will be described. FIGS. 13A through 13C are cross-sectional views illustrating the process for fabricating the semiconductor device of the present embodiment.

First, in the step shown in FIG. 13A, the steps substantially similar to those shown in FIGS. 5A, 5C and 5D according to the second embodiment are carried out, thus forming a lower interlayer dielectric film 11, a lower barrier metal layer 14 and a copper film 15.

Next, in the step shown in FIG. 13B, a known lithography process is performed to form a resist film Re6 having an opening for exposing the upper surface of the copper film 15. Then, Si ions (Si$^+$) are implanted into the copper film 15 using the resist film Re6 as a mask, thus forming a Si-containing copper film 35. In this case, Si ions are implanted at an implant energy of about 180 keV to about 250 key for example, and an implant dose of about $1\times10^{14}$ cm$^{-2}$. If the implant energy is 180 keV, the implant depth of Si atoms is about 0.01 μm, and if the implant energy is 250 keV, the implant depth of Si atoms is about 0.15 μm. Furthermore, if the implant dose is $1\times10^{14}$ cm$^{-2}$, the number of Si atoms in the copper film is approximately $1\times10^{19}$/cm$^3$ (atomic percentage is approximately 0.01%).

In this step, Si ions may be implanted into a part of the lower barrier metal layer 14 at the same time, or Si ions do not have to be implanted into a part of the copper film 15.

Subsequently, in the step shown in FIG. 13C, the resist film Re6 is removed by ashing. Thus, a lower interconnect 36 having the Si-containing copper film 35 is obtained.

Although the subsequent steps are not shown, the steps similar to those shown in FIGS. 3B and 3C according to the first embodiment are carried out, thus obtaining the structure of the semiconductor device shown in FIG. 12.

According to the semiconductor device fabricating method of the present embodiment, the lower interconnect 36 having the Si-containing copper film 35 can be easily formed. Besides, in this structure, the Si in the Si-containing copper film 35 has the function of gettering voids. Therefore, it becomes possible to suppress an increase in contact resistance caused by concentrative gettering of voids in a region of the lower interconnect 36 (within the Si-containing copper film 35) in contact with the upper plug 22a.

In the step shown in FIG. 13B, instead of Si, other dopant having the function of gettering voids (such as Ge, C, Al, Ta, Ti, W, Ni or Co) may alternatively be implanted into the copper film 15. Even in such a case, the effects similar to those of the present embodiment can be achieved.

Modifications of Foregoing Embodiments

In each of the foregoing embodiments, principal portions of the lower interconnect 16 (or 36) and the upper interconnect layer 22 are each formed by a copper film. Alternatively, the inventive semiconductor device may be provided with an interconnect whose principal portion is formed by a film made of a conductive material other than copper, such as a polysilicon film, an aluminum film, an aluminum alloy film or a tungsten film. Even in such a case, the effects similar to those of each of the foregoing embodiments can be achieved.

Instead of the silicon nitride film 24 in each of the foregoing embodiments, an SiON film, an SiOF film, an SiC film, an SiCF film or the like may alternatively be used. If there is almost no possibility of oxidation of the lower interconnect, or if no problem is caused by the oxidation, it is unnecessary to provide the silicon nitride film or a member equivalent to the silicon nitride film.

Suppose no concave portions are provided at the wall surface of the lower interconnect groove. In that case, if the convex portions are provided at the upper surface of the lower interconnect, stress is generated in these portions; therefore, it is possible to achieve the effect of distributing the regions where voids are gettered, which is the basic effect of the present invention.

What is claimed is:

1. A semiconductor device comprising:
   a substrate provided with a semiconductor element;
   a first interlayer dielectric film provided on the substrate;
   a first interconnect groove provided in the first interlayer dielectric film;
   a first interconnect provided within the first interconnect groove and having convex or concave portions at least at one of its side surfaces and bottom surface;
   a second interlayer dielectric film provided over the first interlayer dielectric film and the first interconnect; and
   a first plug that passes through the second interlayer dielectric film and comes into contact with a part of the first interconnect.

2. The semiconductor device according to claim 1, wherein the first interconnect groove is provided at its bottom surface with concave or convex portions, and wherein the convex or concave portions of the first interconnect have shapes corresponding to those of the concave or convex portions of the first interconnect groove.

3. The semiconductor device according to claim 2, wherein the first interconnect comprises:
   a first barrier metal layer formed along side surfaces and a bottom surface of the first interconnect groove; and
   a first copper film formed in the first interconnect groove via the first barrier metal layer.

4. The semiconductor device according to claim 1, wherein the first interconnect groove is provided at its side surfaces with concave or convex portions, and wherein the convex or concave portions of the first interconnect have shapes corresponding to those of the concave or convex portions of the first interconnect groove.

5. The semiconductor device according to claim 4, wherein the first interconnect comprises:
a first barrier metal layer formed along side surfaces and a bottom surface of the first interconnect groove; and
a first copper film formed in the first interconnect groove via the first barrier metal layer.

6. The semiconductor device according to claim 1, wherein the first interconnect groove is provided at its wall surface with concave and convex portions having irregular shapes, and
wherein the convex portions of the first interconnect have shapes corresponding to those of the concave portions in the concave and convex portions of the first interconnect groove.

7. The semiconductor device according to claim 6, wherein the first interconnect comprises:
a first barrier metal layer formed along side surfaces and a bottom surface of the first interconnect groove; and
a first copper film formed in the first interconnect groove via the first barrier metal layer.

8. The semiconductor device according to claim 1, wherein the first interconnect includes a portion formed by a copper film.

9. The semiconductor device according to claim 1, wherein the first interconnect groove is provided at its side surfaces with concave or convex portions, and
wherein the convex or concave portions of the first interconnect have shapes corresponding to those of the concave or convex portions of the first interconnect groove.

10. The semiconductor device according to claim 1, wherein the first interconnect comprises:
a first barrier metal layer formed along side surfaces and a bottom surface of the first interconnect groove; and
a first copper film formed in the first interconnect groove via the first barrier metal layer.

11. The semiconductor device according to claim 1, further comprising:
a second interconnect groove provided in the second interlayer dielectric film;
a second interconnect provided within the second interconnect groove, and
wherein the first plug is connected to a bottom surface of the second interconnect.

12. The semiconductor device according to claim 11, wherein the second interconnect and the first plug are formed integratelly.

13. The semiconductor device according to claim 1, wherein the first plug comprises:
a second barrier metal layer formed along side surfaces and a bottom surface of a connection hole provided in the second interlayer dielectric film; and
a second copper film formed in the connection hole via the second barrier metal layer.

14. The semiconductor device according to claim 1, wherein at a bottom surface of the first interconnect, a lower interconnect and/or a second plug that reaches the substrate are/is provided.

15. The semiconductor device according to claim 1, wherein the first interconnect is an interconnect whose principal portion is selected from any one of a polysilicon film, an aluminum film, an aluminum alloy film or a tungsten film.

16. The semiconductor device according to claim 1, further comprising a ground film provided between the first interconnect and the second interlayer dielectric film,
wherein the ground film is any one of a silicon nitride film, an SiON film, an SiOF film, an SiC film, an SiCF film.

17. The semiconductor device according to claim 1, wherein the first interlayer dielectric film comprises a first layer provided on the substrate and a second layer provided on the first layer, and
the first layer is made of an insulating material having an etch rate different from that of the second layer.

18. A method for fabricating a semiconductor device, the method comprising the steps of:
a) forming a first interlayer dielectric film on a substrate provided with a semiconductor element;
b) forming, in the first interlayer dielectric film, an interconnect groove having concave or convex portions at its bottom surface;
c) filling the interconnect groove with a conductor material, thereby forming an interconnect with convex or concave portions having shapes corresponding to those of the concave or convex portions of the interconnect groove;
d) forming a second interlayer dielectric film over the first interlayer dielectric film and the interconnect; and
e) forming a plug that passes through the second interlayer dielectric film and comes into contact with a part of the interconnect.

19. The method according to claim 18,
wherein the step b) comprises the steps of:
forming, in the first interlayer dielectric film, bottom and side surfaces of the interconnect groove; and
etching the first interlayer dielectric film using an etching mask having openings on the bottom surface of the interconnect groove, thereby forming the concave portions in regions of the bottom surface of the interconnect groove which are exposed to the openings.

20. The method according to claim 18 or 19,
wherein in the step a), a first layer and a second layer are sequentially deposited as the first interlayer dielectric film, the second layer being made of an insulating material having an etch rate different from that of the first layer,
wherein in the step b), the second layer is exposed to side surfaces of the interconnect groove, and
wherein in the step b), side surfaces of the first interlayer dielectric film are etched, thereby forming the concave or convex portions in regions of the side surfaces of the interconnect groove where the second layer is exposed.

21. The method according to claim 18,
wherein the step b) comprises the steps of:
forming, in the first interlayer dielectric film, bottom and side surfaces of the interconnect groove by performing etching such that a deposition film remains on the bottom and side surfaces of the lower interconnect groove; and
etching portions of the first interlayer dielectric film exposed to the first interconnect groove, with the deposition film remaining on the bottom and side surfaces of the interconnect groove, thus forming irregular-shaped concave and convex portions at the bottom and side surfaces of the interconnect groove.

* * * * *